(12) United States Patent
Park et al.

(10) Patent No.: US 10,361,194 B2
(45) Date of Patent: Jul. 23, 2019

(54) SEMICONDUCTOR DEVICES AND METHODS OF FABRICATING THE SAME

(71) Applicant: Samsung Electronics Co., Ltd., Suwon-si, Gyeonggi-do (KR)

(72) Inventors: Moon-Kyu Park, Hwaseong-si (KR); Jae-Yeol Song, Seoul (KR); Hoon-Joo Na, Hwaseong-si (KR); Yoon-Tae Hwang, Seoul (KR); Ki-Joong Yoon, Goyang-si (KR); Sang-Jin Hyun, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/335,984

(22) Filed: Oct. 27, 2016

(65) Prior Publication Data

US 2017/0125408 A1 May 4, 2017

(30) Foreign Application Priority Data

Oct. 30, 2015 (KR) .......................... 10-2015-0151904

(51) Int. Cl.
*H01L 21/02* (2006.01)
*H01L 29/43* (2006.01)
(Continued)

(52) U.S. Cl.
CPC ...... *H01L 27/088* (2013.01); *H01L 21/02345* (2013.01); *H01L 21/02356* (2013.01); *H01L 21/82345* (2013.01); *H01L 21/823431* (2013.01); *H01L 21/823456* (2013.01); *H01L 21/823462* (2013.01); *H01L 21/823842* (2013.01); *H01L 27/0886* (2013.01); *H01L 27/092* (2013.01); *H01L 29/435* (2013.01); *H01L 29/4941* (2013.01); *H01L 29/4958* (2013.01); *H01L 29/4966* (2013.01);
(Continued)

(58) Field of Classification Search
CPC ............... H01L 27/088; H01L 29/4941; H01L 21/823431; H01L 21/82345; H01L 21/823456; H01L 21/823462; H01L 29/7854; H01L 27/0886; H01L 27/092; H01L 27/0924; H01L 29/435; H01L 21/02345; H01L 29/4958
See application file for complete search history.

(56) References Cited

U.S. PATENT DOCUMENTS 5,773,366 A 6/1998 Hwang
6,060,382 A * 5/2000 Lee ................... H01L 21/76826
257/E21.275

(Continued)

FOREIGN PATENT DOCUMENTS

KR 1020090026595 3/2009

*Primary Examiner* — Moazzam Hossain
*Assistant Examiner* — Stanetta D Isaac
(74) *Attorney, Agent, or Firm* — Myers Bigel, P.A.

(57) ABSTRACT

Semiconductor device having less defects in a gate insulating film and improved reliability and methods of forming the semiconductor devices are provided. The semiconductor devices may include a gate insulating film on a substrate and a gate electrode structure on the gate insulating film. The gate electrode structure may include a lower conductive film, a silicon oxide film, and an upper conductive film sequentially stacked on the gate insulating film. The lower conductive film may include a barrier metal layer.

19 Claims, 18 Drawing Sheets

(51) Int. Cl.
  *H01L 29/49*   (2006.01)
  *H01L 29/51*   (2006.01)
  *H01L 29/78*   (2006.01)
  *H01L 27/088*  (2006.01)
  *H01L 27/092*  (2006.01)
  *H01L 21/8234* (2006.01)
  *H01L 21/8238* (2006.01)

(52) U.S. Cl.
  CPC ........ *H01L 29/4983* (2013.01); *H01L 29/518* (2013.01); *H01L 29/785* (2013.01); *H01L 29/7851* (2013.01); *H01L 29/7854* (2013.01); *H01L 29/7856* (2013.01); *H01L 21/823807* (2013.01); *H01L 21/823821* (2013.01); *H01L 27/0924* (2013.01); *H01L 29/513* (2013.01); *H01L 29/517* (2013.01)

(56) References Cited

U.S. PATENT DOCUMENTS

| | | |
|---|---|---|
| 6,815,334 B2 | 11/2004 | Yoon |
| 7,582,525 B2 | 9/2009 | Kong et al. |
| 7,582,924 B2 | 9/2009 | Lee et al. |
| 7,919,820 B2 | 4/2011 | Chung et al. |
| 8,115,264 B2 | 2/2012 | Park et al. |
| 8,168,491 B2 | 5/2012 | Rho |
| 8,748,251 B2 | 6/2014 | Na et al. |
| 2007/0018220 A1 | 1/2007 | Lee et al. |
| 2009/0321842 A1 | 12/2009 | Matsubara |
| 2010/0123220 A1* | 5/2010 | Burke ............... H01L 29/407 257/630 |
| 2013/0221445 A1 | 8/2013 | Lei et al. |
| 2013/0302958 A1* | 11/2013 | Hossain ........... H01L 29/66348 438/270 |
| 2014/0061781 A1* | 3/2014 | Kim ................ H01L 27/10876 257/331 |
| 2015/0123167 A1 | 5/2015 | Ji et al. |
| 2015/0214226 A1* | 7/2015 | Su .................. H01L 27/0886 257/401 |
| 2016/0247909 A1* | 8/2016 | Matsuno ......... H01L 29/66825 |

* cited by examiner

SEMICONDUCTOR DEVICES AND METHODS OF FABRICATING THE SAME

CROSS-REFERENCE TO RELATED APPLICATION

This application claims priority under 35 U.S.C. § 119 to Korean Patent Application No. 10-2015-0151904 filed on Oct. 30, 2015, in the Korean Intellectual Property Office, the disclosure of which is hereby incorporated by reference in its entirety.

BACKGROUND

The present disclosure generally relates to the field of electronics and, more particularly, to semiconductor devices and methods of fabricating the same.

Increased distribution of information media has led into remarkable advancement in functionalities of semiconductor devices. To increase competitiveness, higher integration may be used in new semiconductor devices to meet demands for lower cost and higher quality. The scale-down of semiconductor devices may continue to achieve higher integration.

Research has increased the operating speed of semiconductor devices and enhanced integration thereof. Semiconductor devices may include MOS transistors. To increase the density of semiconductor devices, gates of the MOS transistors may decrease in size, and underlying channel regions of the gates may also become narrower.

SUMMARY

A semiconductor device may include a gate insulating layer on a substrate and a gate electrode structure on the gate insulating layer. The gate electrode structure may include a lower conductive layer and an upper conductive layer sequentially stacked on the gate insulating layer and a silicon oxide layer between the lower conductive layer and the upper conductive layer, and the lower conductive layer may include a barrier metal layer.

In various embodiments, the gate electrode structure may further include a semiconductor liner between the silicon oxide layer and the lower conductive layer.

According to various embodiments, the semiconductor liner may include a silicon layer.

In various embodiments, the semiconductor device may further include an interlayer insulating layer on the substrate. The interlayer insulating layer may include a trench, and the gate insulating layer may extend along a sidewall and a bottom surface of the trench In various embodiments, the gate electrode structure may be in a lower portion of the trench, and the semiconductor device may further include a capping pattern on the upper conductive layer. The capping pattern may be in an upper portion of the trench.

In various embodiments, the gate insulating layer may include an interfacial layer and a high-k insulating material layer sequentially stacked on the substrate.

According to various embodiments, the interfacial layer may include silicon oxide.

In various embodiments, the semiconductor device may further include a channel layer between the substrate and the gate insulating layer. The channel layer may have a lattice constant different from a lattice constant of the substrate.

In various embodiments, the semiconductor device may further include a fin-shaped active region protruding from the substrate, and the gate electrode structure crosses the fin-shaped active region.

A semiconductor device may include a fin-shaped active region protruding from a substrate and a field insulating layer on the substrate. The field insulating layer may be on a side of a lower portion of the fin-shaped active region and may expose an upper portion of the fin-shaped active region. The semiconductor device may further include a gate insulating layer extending along an upper surface of the field insulating layer and a surface of the upper portion of the fin-shaped active region and a gate electrode structure on the gate insulating layer. The gate electrode structure may include a silicon oxide layer spaced apart from the gate insulating layer and a barrier metal layer between the silicon oxide layer and the gate insulating layer.

According to various embodiments, the silicon oxide layer may extend along a surface of the gate insulating layer.

In various embodiments, the gate insulating layer may include an interfacial layer extending along the surface of the upper portion of the fin-shaped active region, and the interfacial layer may include silicon oxide.

In various embodiments, the gate electrode structure may include an upper conductive layer on the silicon oxide layer, and the silicon oxide layer may be between the barrier metal layer and the upper conductive layer.

A semiconductor device may include a substrate including a first region and a second region, a first gate insulating layer on the first region of the substrate and a first gate electrode structure on the first gate insulating layer. The first gate electrode structure may include a first lower conductive layer, a first silicon oxide layer and a first upper conductive layer sequentially stacked on the first gate insulating layer, and the first lower conductive layer may include a first barrier metal layer. The semiconductor device may further include a second gate insulating layer on the second region of the substrate and a second gate electrode structure on the second gate insulating layer. The second gate electrode structure may include a second lower conductive layer and a second upper conductive layer sequentially stacked on the second gate insulating layer.

In various embodiments, the second gate electrode structure may further include a second silicon oxide layer.

According to various embodiments, the second silicon oxide layer may be disposed between the second lower conductive layer and the second upper conductive layer.

In various embodiments, the second gate electrode structure further may include a semiconductor liner between the second silicon oxide layer and the second gate insulating layer.

According to various embodiments, the semiconductor liner may not contact the second gate insulating layer.

In various embodiments, the second gate electrode structure further may include a semiconductor liner between the second lower conductive layer and the second upper conductive layer.

According to various embodiments, the second gate electrode structure may not include a silicon oxide layer between the semiconductor liner and the second upper conductive layer.

In various embodiments, the second gate electrode structure may not include a silicon oxide layer between the second lower conductive layer and the second upper conductive layer.

In various embodiments, the first gate electrode structure further may include a semiconductor liner between the first silicon oxide layer and the first lower conductive layer.

In various embodiments, the semiconductor liner may include either a silicon layer or a silicon germanium layer.

According to various embodiments, the semiconductor device may also include an interlayer insulating layer on the substrate. The interlayer insulating layer may include a first trench and a second trench, the first gate insulating layer may extend along a sidewall and a bottom surface of the first trench, and the second gate insulating layer may extend along a sidewall and a bottom surface of the second trench.

In various embodiments, the semiconductor device may also include a first fin-shaped active region protruding from the first region of the substrate and a second fin-shaped active region protruding from the second region of the substrate. The first gate electrode structure may cross the first fin-shaped active region, and the second gate electrode structure may cross the second fin-shaped active region.

A semiconductor device may include a fin-shaped active region protruding from a substrate and a field insulating layer on the substrate. The field insulating layer may be on a side of a lower portion of the fin-shaped active region and may expose an upper portion of the fin-shaped active region. The semiconductor device may further include a first silicon oxide layer extending along a surface of the upper portion of the fin-shaped active region, a high-k insulating layer on the first silicon oxide layer and the field insulating layer, a barrier metal layer on the high-k insulating layer and a second silicon oxide layer on the barrier metal layer. The barrier metal layer may extend between the second silicon oxide layer and the high-k insulating layer and the second silicon oxide layer may extend along an upper surface of the field insulating layer. The semiconductor device may also include an upper gate electrode on the second silicon oxide layer. The upper gate electrode may cross the fin-shaped active region.

In various embodiments, the second silicon oxide layer may extend along a surface of the high-k insulating layer.

According to various embodiments, the semiconductor device may also include a silicon layer between the barrier metal layer and the second silicon oxide layer.

A semiconductor device may include a gate insulating layer on a substrate and a lower gate electrode on the gate insulating layer. The lower gate electrode may include a barrier metal layer. The semiconductor device may further include a silicon oxide layer on the lower gate electrode and an upper gate electrode on the silicon oxide layer. The upper gate electrode may have a thickness different from a thickness of the lower gate electrode.

According to various embodiments, the thickness of the upper gate electrode may be greater than the thickness of the lower gate electrode.

According to various embodiments, the semiconductor device may also include an interlayer insulating layer on the substrate. The interlayer insulating layer may include a trench, and the thickness of the lower gate electrode on a sidewall of the trench may be different from the thickness of the upper gate electrode on the sidewall of the trench.

A semiconductor device may include an interlayer insulating layer on a substrate. The interlayer insulating layer may include a trench. The semiconductor device may further include a gate insulating layer extending along a sidewall and a bottom surface of the trench and a gate electrode structure on the gate insulating layer in the trench. The gate electrode structure may include an insertion insulating layer that may be spaced apart from the gate insulating layer and may be on the sidewall and the bottom surface of the trench, and the insertion insulating layer may include an oxide, oxynitride or nitride of a semiconductor material.

In various embodiments, the insertion insulating layer may include silicon oxide, silicon oxynitride, silicon nitride and/or germanium oxide.

According to various embodiments, the gate electrode structure may further include a semiconductor liner between the insertion insulating layer and the gate insulating layer.

According to various embodiments, the semiconductor liner may include a silicon layer, a silicon germanium layer and/or a germanium layer.

In various embodiments, the semiconductor liner may not contact the gate insulating layer.

In various embodiments, the gate insulating layer may include an interfacial layer on the bottom surface of the trench and a high-k insulating layer that may extend along the sidewall and the bottom surface of the trench and may be on the interfacial layer.

According to various embodiments, each of the interfacial layer and the insertion insulating layer may include silicon oxide.

A method of fabricating a semiconductor device may include forming a gate insulating layer on a substrate, sequentially forming a lower gate electrode and a silicon layer on the gate insulating layer, oxidizing the silicon layer to form a silicon oxide layer, performing a heat treatment process while the silicon oxide layer may be exposed and forming an upper gate electrode on the silicon oxide layer after performing the heat treatment process.

According to various embodiments, forming the lower gate electrode may include forming a barrier metal layer.

According to various embodiments, forming the barrier metal layer and forming the silicon layer may be performed without exposing the substrate to oxygen.

In various embodiments, the silicon layer may be formed to directly contact the barrier metal layer.

In various embodiments, oxidizing the silicon layer may include oxidizing an upper portion of the silicon layer, and a lower portion of the silicon layer may remain between the silicon oxide layer and the lower gate electrode after oxidizing the silicon layer.

According to various embodiments, the method may further include removing the upper gate electrode using the silicon oxide layer as an etch stopping layer.

A method of fabricating a semiconductor device may include forming a first gate insulating layer on a first region of a substrate and forming a second gate insulating layer on a second region of the substrate, sequentially forming a first lower gate electrode and a first silicon layer on the first gate insulating layer and sequentially forming a second lower gate electrode and a second silicon layer on the second gate insulating layer, oxidizing the first silicon layer to form a first silicon oxide layer and oxidizing the second silicon layer to form a second silicon oxide layer, performing a heat treatment process while the first and second silicon oxide layers are exposed, forming a first conductive layer on the first silicon oxide layer and forming a second conductive layer on the second silicon oxide layer after performing the heat treatment process, removing the first conductive layer using the first silicon oxide layer as an etch stopping layer and forming a third conductive layer on the first silicon oxide layer and forming a fourth conductive layer on the second conductive layer after removing the first conductive layer.

In various embodiments, sequentially forming the first lower gate electrode and the first silicon layer may include sequentially forming a first barrier metal layer and the first silicon layer without exposing the substrate to oxygen, and sequentially forming the second lower gate electrode and the second silicon layer may include sequentially forming a second barrier metal layer and the second silicon layer without exposing the substrate to oxygen.

According to various embodiments, the first silicon layer may be formed to directly contact the first barrier metal layer, and the second silicon layer may be formed to directly contact the second barrier metal layer.

In various embodiments, oxidizing the first silicon layer may include oxidizing an upper portion of the first silicon layer, and a lower portion of the first silicon layer may remain between the first silicon oxide layer and the first lower gate electrode after oxidizing the first silicon layer, and oxidizing the second silicon layer may include oxidizing an upper portion of the second silicon layer, and a lower portion of the second silicon layer may remain between the second silicon oxide layer and the second lower gate electrode after oxidizing the second silicon layer.

A method of forming an integrated circuit device may include sequentially forming a gate insulating layer and a barrier metal layer on a substrate, forming a silicon oxide layer on the barrier metal layer and forming a gate electrode on the silicon oxide layer, the silicon oxide layer being between the barrier metal layer and the gate electrode.

In various embodiments, forming the silicon oxide layer may include forming a silicon layer on the barrier metal layer and oxidizing the silicon layer.

According to various embodiments, forming the barrier metal layer and forming the silicon layer may be performed without exposing the substrate to oxygen.

In various embodiments, the silicon layer may directly contact the barrier metal layer.

In various embodiments, the barrier metal layer may include a titanium nitride (TiN) layer.

In various embodiments, oxidizing the silicon layer may include oxidizing an upper portion of the silicon layer, and a lower portion of the silicon layer may remain between the silicon oxide layer and the barrier metal layer after oxidizing the silicon layer.

According to various embodiments, the method may further include performing a heat treatment process after forming the silicon oxide layer while the silicon oxide layer may be exposed.

According to various embodiments, the gate insulating layer may include a high-k material.

In various embodiments, the method may further include removing the gate electrode using the silicon oxide layer as an etch stopping layer.

According to various embodiments, the method may further include forming an insulation layer on the substrate before forming the gate insulating layer and the barrier metal layer. The insulation layer may include a recess exposing the substrate, and the barrier metal layer and the silicon oxide layer may be conformally formed along an inner surface of the recess.

BRIEF DESCRIPTION OF THE DRAWINGS

The above and other objects, features and advantages of the present disclosure will become more apparent to those of ordinary skill in the art by describing in detail example embodiments thereof with reference to the accompanying drawings, in which.

DETAILED DESCRIPTION

Figure 1:
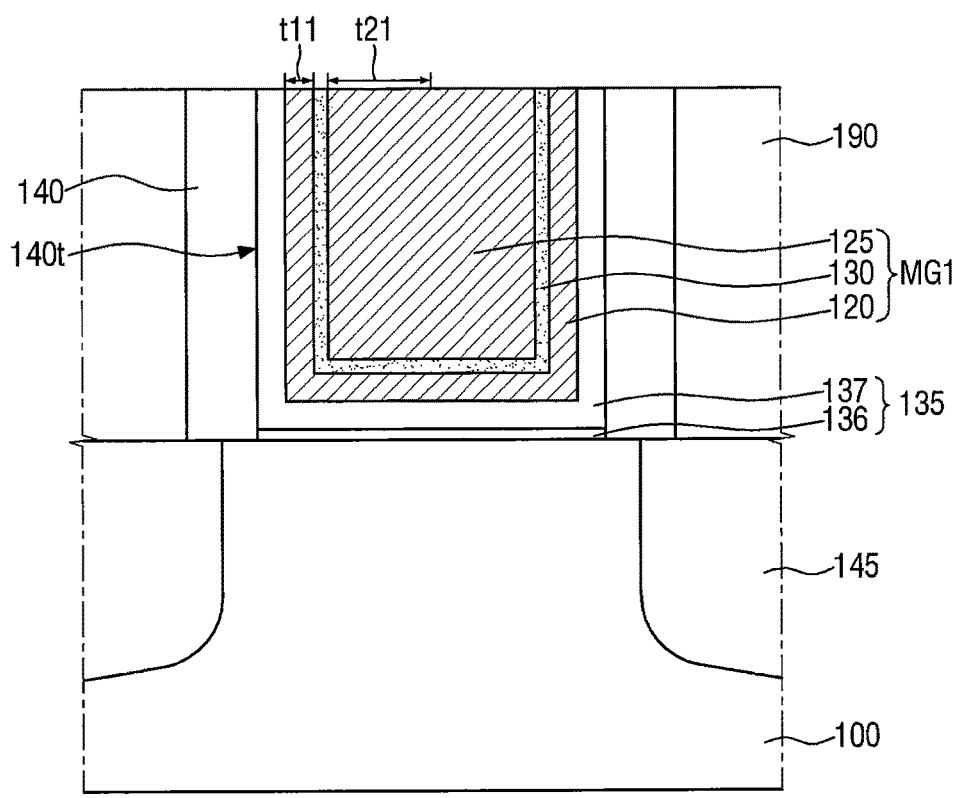
FIG. 1 is a view illustrating a semiconductor device according to some example embodiments.

Advantages and features of the present inventive concepts and methods of accomplishing the same may be understood more readily by reference to the following detailed description of example embodiments and the accompanying drawings. The present inventive concepts may, however, be embodied in many different forms and should not be construed as being limited to the embodiments set forth herein. Rather, these embodiments are provided so that this disclosure will be thorough and complete and will fully convey the concept of the invention to those skilled in the art, and the present inventive concepts will only be defined by the appended claims. In the drawings, the thickness of layers and regions are exaggerated for clarity.

It will be understood that when an element or layer is referred to as being "connected to," or "coupled to" another element or layer, it can be directly connected to or coupled to another element or layer or intervening elements or layers may be present. In contrast, when an element is referred to as being "directly connected to" or "directly coupled to" another element or layer, there are no intervening elements or layers present. Like numbers refer to like elements throughout. As used herein, the term "and/or" includes any and all combinations of one or more of the associated listed items.

It will also be understood that when a layer is referred to as being "on" another layer or substrate, it can be directly on the other layer or substrate, or intervening layers may also be present. In contrast, when an element is referred to as being "directly on" another element, there are no intervening elements present.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present inventive concepts.

The use of the terms "a" and "an" and "the" and similar referents in the context of describing the embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which the inventive concepts belong. It is noted that the use of any and all examples, or terms provided herein is intended merely to better illuminate the inventive concepts and is not a limitation on the scope of the inventive concepts unless otherwise specified. Further, unless defined otherwise, all terms defined in generally used dictionaries may not be overly interpreted.

Although several drawings illustrate that semiconductor devices according to some example embodiments include a fin-type transistor (FinFET) comprising a channel region having a fin-shaped region, the inventive concepts are not limited thereto. Semiconductor devices according to some example embodiments may include a tunneling FET, a transistor comprising nanowire, a transistor comprising nano-sheet, or a three-dimensional (3D) transistor. Further, semiconductor devices according to some embodiments may include a bipolar junction transistor, a laterally diffused metal oxide semiconductor (LDMOS) transistor, and so on.

FIG. 1 is a view illustrating a semiconductor device according to some example embodiments.

Referring to FIG. 1, the semiconductor device according to some example embodiments may include a first gate spacer 140, a first trench 140t, a first gate insulating film 135, and a first gate electrode structure MG1 on a substrate 100. The first gate electrode structure MG1 may include a first lower conductive film 120, a first upper conductive film 125 and a first insertion insulating film 130.

The substrate 100 may be a bulk silicon or a silicon-on-insulator (SOI). In some embodiments, the substrate 100 may be a silicon substrate or may include, for example, silicon germanium, silicon germanium on insulator (SGOI), indium antimonide, lead telluride, indium arsenide, indium phosphide, gallium arsenide, or gallium antimonide, but not limited thereto.

For convenience of description, the following description will be made on condition that the substrate 100 includes silicon.

The first gate spacer 140 may be formed on the substrate 100. The first gate spacer 140 may be formed as a single layer as illustrated in FIG. 1, but the first gate spacer 140 is not limited thereto and may be formed as a multi-layer structure.

For example, the first gate spacer 140 may include at least one of silicon nitride (SiN), silicon oxynitride (SiON), silicon oxide ($SiO_2$), silicon oxycarbonitride (SiOCN) and a combination thereof.

In some embodiments, the first gate spacer 140 may function as a guide for forming a self aligned contact. For this purpose, the first gate spacer 140 may include a material having an etch selectivity with respect to an interlayer insulating film 190 described below.

The first trench 140t may be defined by the first gate spacer 140. For example, a side wall of the first trench 140t may be defined by the first gate spacer 140 and a bottom surface thereof may be defined by an upper surface of the substrate 100.

The interlayer insulating film 190 may be formed on the substrate 100. The interlayer insulating film 190 may surround an outer sidewall of the first gate spacer 140 that defines the first trench 140t. The interlayer insulating film 190 may include the first trench 140t.

The interlayer insulating film 190 may include, for example, silicon oxide, silicon nitride, silicon oxynitride, and/or a low-k dielectric material. For example, the low-k dielectric material may include, but is not limited to, flowable oxide (FOX), tonen silazene (TOSZ), undoped silica glass (USG), borosilica glass (BSG), phosphosilica glass (PSG), borophosphosilicate glass (BPSG), plasma enhanced tetraethyl orthosilicate (PETEOS), fluoride silicate glass (FSG), carbon doped silicon oxide (CDO), xerogel, aerogel, amorphous fluorinated carbon, organo silicate glass (OSG), parylene, bis-benzocyclobutenes (BCB), SiLK, polyimide, and/or porous polymeric materials.

The interlayer insulating film 190 may be formed as a single layer as illustrated in FIG. 1, but the interlayer insulating film 190 is not limited thereto. The interlayer insulating film 190 may be formed as a multi-layer structure. In some embodiments, at least a portion of the interlayer insulating film 190 may include impurities such as silicon and/or germanium.

The first gate insulating film 135 may be formed on the substrate 100. The first gate insulating film 135 may be formed along the sidewall and the bottom surface of the first trench 140t.

The first gate insulating film 135 may include a first interfacial layer 136 and a first high-k insulating film 137 sequentially stacked on the substrate 100.

The first interfacial layer 136 may be formed on the substrate 100. The first interfacial layer 136 may be formed on the bottom surface of the first trench 140t.

The first interfacial layer 136 may not be formed on the sidewall of the first trench 140t as illustrated in FIG. 1, but not limited thereto. In some embodiments, according to a method of forming the first interfacial layer 136, the first interfacial layer 136 may be formed on the sidewall of the first trench 140t as well as the on the bottom surface of the first trench 140t.

The first interfacial layer 136 may include, for example, silicon oxide, but not limited thereto. The first interfacial layer 136 may include materials other than silicon oxide according to materials included in the substrate 100 and the first high-k insulating film 137.

The first high-k insulating film 137 may be formed on the first interfacial layer 136. The first high-k insulating film 137 may be formed along the bottom surface and sidewall of the first trench 140t. In some embodiments, the first high-k insulating film 137 may be conformally formed along the bottom surface and the sidewall of the first trench 140t as illustrated in FIG. 1.

In some embodiments, the first high-k insulating film 137 may include metal oxide. For example, the first high-k insulating film 137 may include hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide and/or lead zinc niobate.

In some embodiments addition, the first high-k insulating film 137 may include a nitride of the metal material described above (e.g., hafnium nitride) and/or an oxynitride of the metal material described above (e.g., hafnium oxynitride), but not limited thereto.

The first gate electrode structure MG1 may be formed on the first gate insulating film 135. The first gate electrode structure MG1 may be in the first trench 140t. In some embodiments, the first gate electrode structure MG1 may fill the first trench 140t. An upper surface of the first gate electrode structure MG1 may be coplanar with an upper surface of the interlayer insulating film 190.

The first lower conductive film 120 may be formed on the first gate insulating film 135. The first lower conductive film 120 may be formed along the sidewall and the bottom of the first trench 140t. In other words, the first lower conductive film 120 may be formed along the profile of the first gate insulating film 135. In some embodiments, the first lower conductive film 120 may be conformally formed along a surface of the first gate insulating film 135 as illustrated in FIG. 1.

The first lower conductive film 120 may include, for example, at least one of titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN) and a combination thereof. In some embodiments, the first lower conductive film 120 may include an oxidized form of the aforementioned material. The first lower conductive film 120 may be a single film or a stack of films of the aforementioned materials. In some embodiments, the first lower conductive film 120 may include a first barrier metal layer. The first barrier metal layer may include, for example, titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN) and/or oxidized material thereof (e.g., titanium oxynitride, tantalum oxynitride.) It will be understood that "a barrier metal layer" refers to a layer that reduces or possibly blocks a diffusion of metal from an upper portion of a gate electrode to a lower portion of the gate electrode (e.g., a gate insulating film) or a substrate.

The first insertion insulating film 130 may be formed on the first lower conductive film 120. The first insertion insulating film 130 may be formed along the sidewall and bottom surface of the first trench 140t. The first insertion insulating film 130 may be formed along a profile of the first lower conductive film 120. In some embodiments, the first insertion insulating film 130 may be conformally formed along a surface of the first lower conductive film 120 as illustrated in FIG. 1. In some embodiments, the first insertion insulating film 130 may directly contact the first lower conductive film 120. In some embodiments, the first insertion insulating film 130 may directly contact the first barrier metal layer of the first lower conductive film 120.

The first insertion insulating film 130 may be formed to be spaced apart from the first gate insulating film 135. That is, since the first lower conductive film 120 is interposed between the first insertion insulating film 130 and the first gate insulating film 135, a surface of the first insertion insulating film 130 and a surface of the first gate insulating film 135 which face each other do not contact each other on the bottom surface of the first trench 140t.

The first insertion insulating film 130 may include at least one of an oxide, oxynitride and nitride of a semiconductor material. The first insertion insulating film 130 may include, for example, at least one of silicon oxide, silicon oxynitride, silicon nitride and germanium oxide.

In some embodiments, the first insertion insulating film 130 may function as a capping layer during a heat treatment process that may be performed to remove defects in the first high-k insulating film 137. In some embodiments, during formation of the first upper conductive film 125, the first insertion insulating film 130 may function as an etch stopping layer as well.

The following description will be made on condition that the first insertion insulating film 130 is a silicon oxide film.

The first upper conductive film 125 may be formed on the first insertion insulating film 130. The first upper conductive film 125 may be formed along the sidewall and bottom surface of the first trench 140t. In other words, the first upper conductive film 125 may be formed along a profile of the first insertion insulating film 130.

The first upper conductive film 125 may include a metal, metal nitride, metal carbide or the like and may include, for example, at least one of TiN, WN, Ru, TiAl, TiAlN, TiAlC—N TaN, TiAlC, TiC, TaC, TaCN, TaSiN, W, Al, Cu, Co, Ti, Ta, Ni, Pt, Ni—Pt, Nb, NbN, NbC, Mo, MoN, MoC, WC, Ru, Rh, Pd, Ir, Os, Ag, Au, Zn, V, Fe, Cr, Cd and a combination thereof.

The first upper conductive film 125 may include conductive metal oxide, conductive metal oxynitride or the like, or an oxidized form of the aforementioned material. The first upper conductive film 125 may be a single film or a stack of films of the aforementioned materials.

The first insertion insulating film 130 may include an insulating material. The first insertion insulating film 130 may have a thickness that does not have a great influence on threshold voltage of the semiconductor device. In some embodiments, the first insertion insulating film 130 may have a thickness enabling control of work function.

The first gate electrode structure MG1 may have a structure in which the first lower conductive film 120 with conductivity, the first insertion insulating film 130 with insulating property and the first upper conductive film 125 with conductivity are sequentially stacked.

As illustrated in FIG. 1, the first gate insulating film 135 with insulating property, the first lower conductive film 120 with conductivity, the first insertion insulating film 130 with insulating property and the first upper conductive film 125 with conductivity may be sequentially formed on the upper surface of the substrate 100. That is, one or more insulating films and one or more conductive films may be alternately stacked on the substrate 100.

A thickness of the first lower conductive film 120 may be different from that of the first upper conductive film 125. For example, the thickness of the first lower conductive film 120 may be less than that of the first upper conductive film 125.

Taking into consideration the formation process of the first gate electrode structure MG1, a thickness t21 of the first upper conductive film 125 on the sidewall of the first trench 140t may be greater than a thickness t11 of the first lower conductive film 120 on the sidewall of the first trench 140t as illustrated in FIG. 1. In this case, the thickness t21 of the first upper conductive film 125 on the sidewall of the first trench 140t may be half a width of the first upper conductive film 125 which fills the first trench 140t on the first insertion insulating film 130.

A first source/drain region 145 may be formed adjacent to the first gate electrode structure MG1.

The first source/drain region 145 may be an impurity region formed in the substrate 100, as illustrated, but not limited thereto. The first source/drain region 145 may include an epitaxial layer formed on or in the substrate 100.

In addition, the first source/drain region 145 may be a protruding source/drain region having an upper surface which protrudes from the upper surface of the substrate 100.

Figure 2:
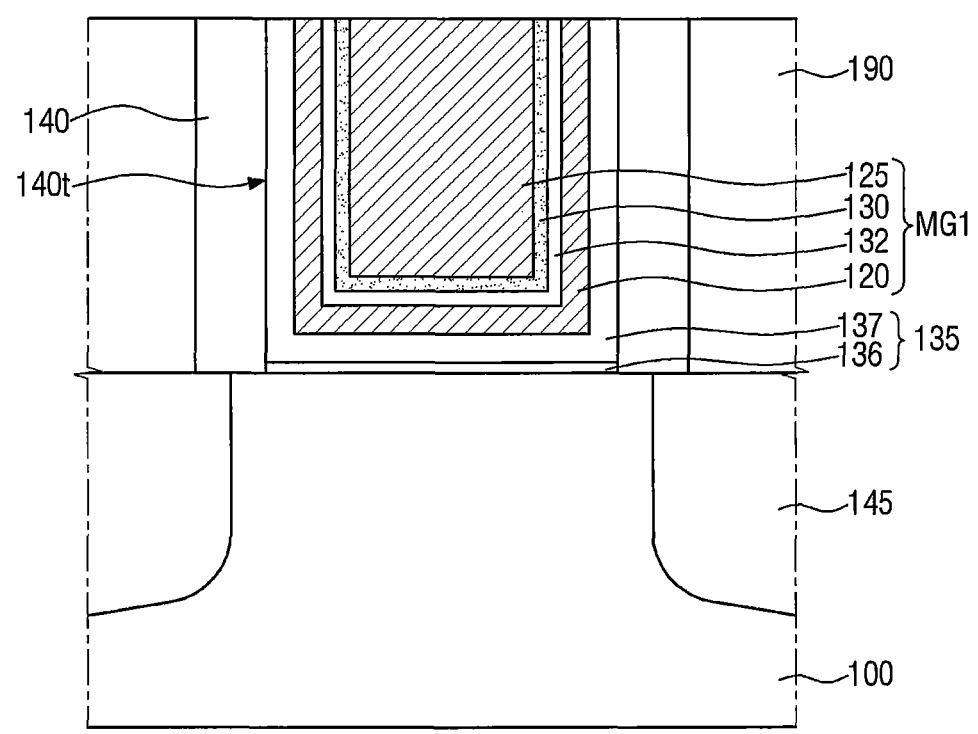
FIG. 2 is a view illustrating a semiconductor device according to some example embodiments.

FIG. 2 is a view illustrating a semiconductor device according to some example embodiments. For convenience of description, the following description will be made based on difference from the description with respect to FIG. 1.

Referring to FIG. 2, in the semiconductor device according to some example embodiments, the first gate electrode structure MG1 may further include a first semiconductor liner 132.

The first semiconductor liner 132 may be formed between the first lower conductive film 120 and the first upper conductive film 125. The first semiconductor liner 132 may be formed between the first gate insulating film 135 and the first insertion insulating film 130. More specifically, the first semiconductor liner 132 may be formed between the first insertion insulating film 130 and the first lower conductive film 120.

The first semiconductor liner 132 may be formed on the first lower conductive film 120. The first semiconductor liner 132 may be formed along the sidewall and bottom surface of the first trench 140t. The first semiconductor liner 132 may be formed along the profile of the first lower conductive film 120. In some embodiments, the first semiconductor liner 132 may be conformally formed along a surface of the first lower conductive film 120 as illustrated in FIG. 2. In some embodiments, the first semiconductor liner 132 may directly contact the first lower conductive film 120. In some embodiments, the first semiconductor liner 132 may directly contact the first barrier material layer of the first lower conductive film 120.

The first semiconductor liner 132 and the first insertion insulating film 130 may be formed along the profile of the first lower conductive film 120 on the first lower conductive film 120.

The first semiconductor liner 132 may be formed to be spaced apart from the first gate insulating film 135. Since the first lower conductive film 120 is interposed between the first semiconductor liner 132 and the first gate insulating film 135, a surface of the first semiconductor liner 132 and a surface of the first gate insulating film 135 which face each other do not contact each other on the bottom of the first trench 140t.

The first semiconductor liner 132 may include a semiconductor material. The first semiconductor liner 132 may include, for example, at least one of a silicon film, a silicon germanium film and a germanium film.

The first insertion insulating film 130 on the first semiconductor liner 132 may include an oxide, oxynitride or nitride of the first semiconductor liner 132.

The following description will be made on condition that the first semiconductor liner 132 is a silicon film.

Figure 3:
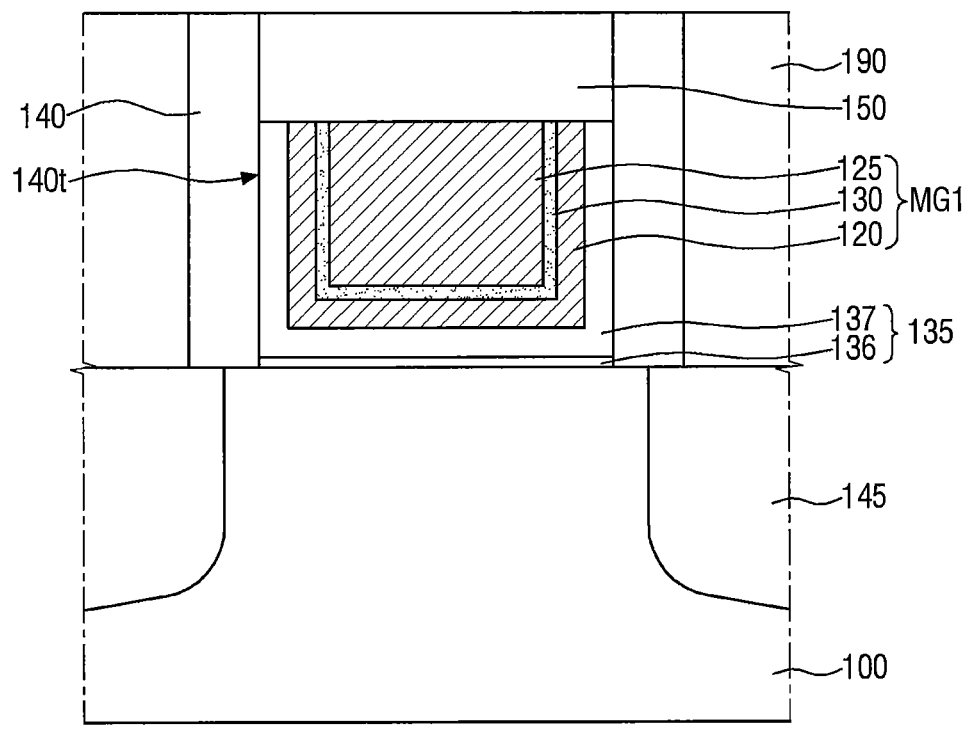
FIG. 3 is a view illustrating a semiconductor device according to some example embodiments.

FIG. 3 is a view illustrating a semiconductor device according to some example embodiments. For convenience of description, the following description will be made based on difference from the description with respect to FIG. 1.

Referring to FIG. 3, the semiconductor device according to some example embodiments may further include a capping pattern 150.

The first gate electrode structure MG1 may fill a lower portion of the first trench 140t. For example, the upper surface of the first upper conductive film 125 may be lower than the upper surface of the interlayer insulating film 190.

The capping pattern 150 may be formed on the first gate electrode structure MG1 and the first gate insulating film 135. In other words, the capping pattern 150 may be formed on the first lower conductive film 120 and the first upper conductive film 125.

The capping pattern 150 may be formed by filling a upper portion of the first trench 140t.

Since the capping pattern 150 is formed by filling the upper portion of the first trench 140t, the upper surface of the capping pattern 150 may be coplanar with the upper surface of the first gate spacer 140 and the upper surface of the interlayer insulating film 190.

In some embodiments, the capping pattern 150 may function as a guide for forming a self aligned contact, and thus the capping pattern 150 may include a material having an etch selectivity with respect to the interlayer insulating film 190. The capping pattern 150 may include, for example, at least one of silicon nitride (SiN), silicon oxynitride (SiON), silicon oxide ($SiO_2$), silicon carbonitride (SiCN), silicon oxycarbonitride (SiOCN) and a combination thereof.

In some embodiments, unlike as shown in FIG. 3, the first gate insulating film 135 may extend between the first gate spacer 140 and the capping pattern 150. That is, a portion of the first gate insulating film 135 may extend between an inner sidewall of the first gate spacer 140 and a sidewall of the capping pattern 150 which face each other.

Figure 4:
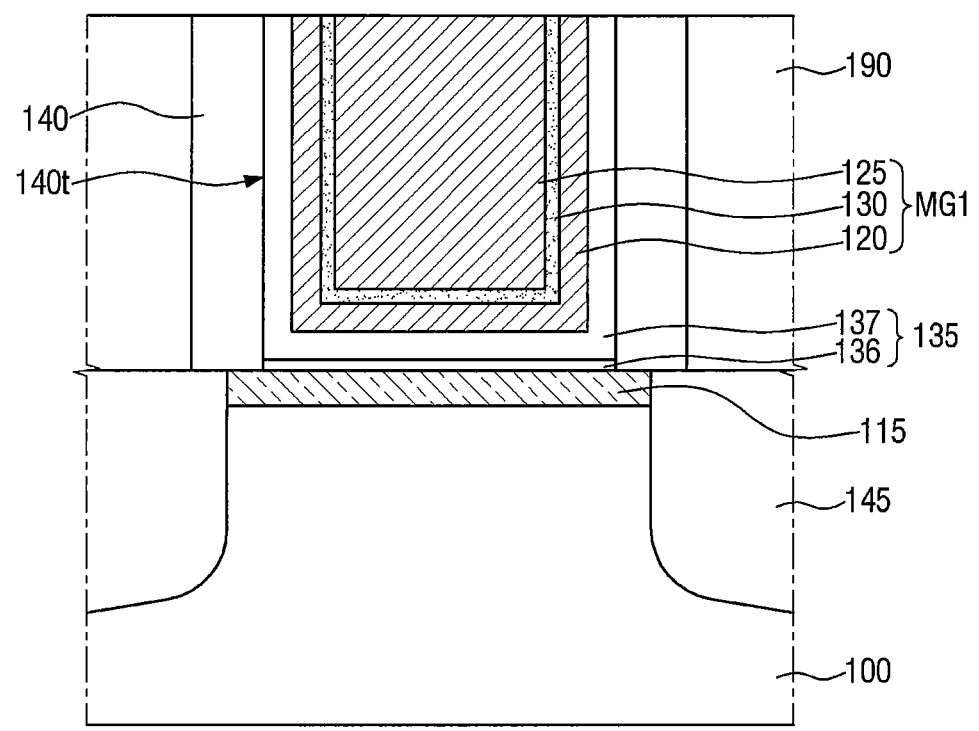
FIG. 4 is a view illustrating a semiconductor device according to some example embodiments.

FIG. 4 is a view illustrating a semiconductor device according to some example embodiments. For convenience of description, the following description will be made based on difference from the description with respect to FIG. 1.

Referring to FIG. 4, the semiconductor device according to some example embodiments may further include a first channel layer 115 between the first gate electrode structure MG1 and the substrate 100.

The first channel layer 115 may be formed between the substrate 100 and the first gate insulating film 135. The first channel layer 115 may be formed on the substrate 100.

The first channel layer 115 may include a material different from a material included in the substrate 100. For example, the first channel layer 115 may include a material which has a different lattice constant from that of the substrate 100.

When the substrate 100 is a silicon substrate, the first channel layer 115 may include silicon germanium having a greater lattice constant than that of silicon.

In some embodiments, the substrate 100 may include silicon germanium, and the first channel layer 115 may include silicon germanium or germanium having a greater lattice constant than that of silicon germanium included in the substrate 100. In some embodiments, the first channel layer 115 may include silicon having a less lattice constant than that of silicon germanium included in the substrate 100.

Figure 5:
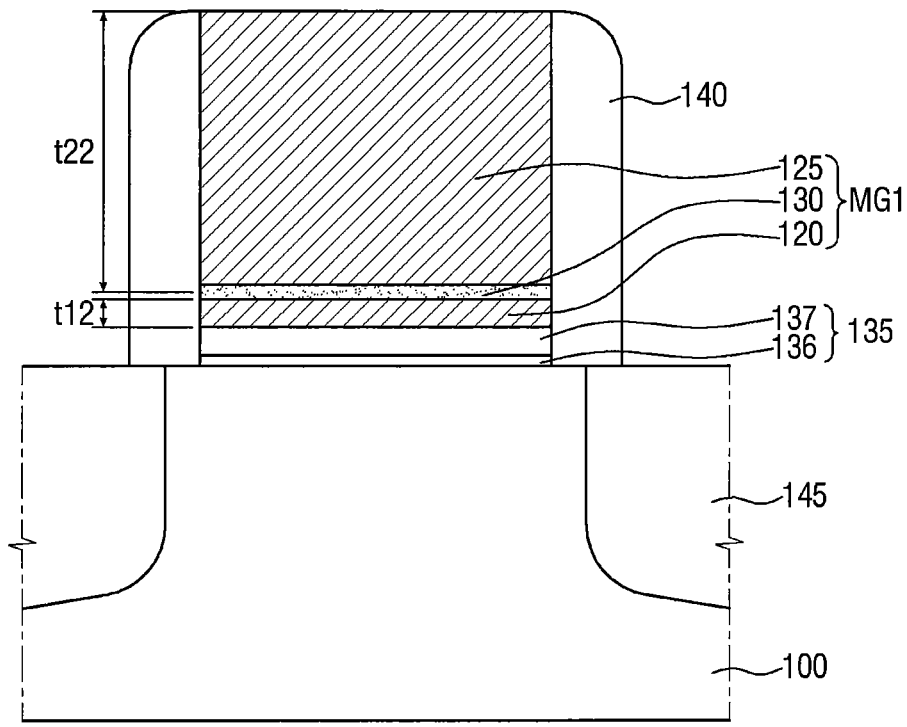
FIG. 5 is a view illustrating a semiconductor device according to some example embodiments.

FIG. 5 is a view illustrating a semiconductor device according to some example embodiments. For convenience of description, the following description will be made based on difference from the description with respect to FIG. 1.

Referring to FIG. 5, the first high-k insulating film 137 may not include a portion which extends between the first gate electrode structure MG1 and the first gate spacer 140.

In addition, in the first gate electrode structure MG1, the first lower conductive film 120 and the first insertion insulating film 130 may not include portions which extend along the inner sidewall of the first gate spacer 140.

For example, the thickness t12 of the first lower conductive film 120 may be less than the thickness t22 of the first upper conductive film 125. The thickness t22 of the first upper conductive film 125 on the upper surface of the substrate 100 may be greater than the thickness t12 of the first lower conductive film 120 on the upper surface of the substrate 100.

Figure 6:
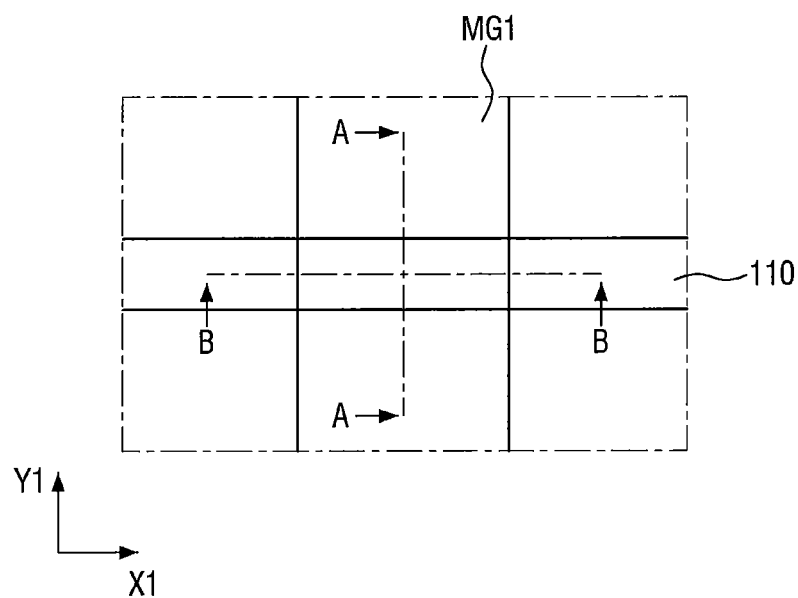
FIG. 6 is a layout of a semiconductor device according to some example embodiments.
Figure 7:
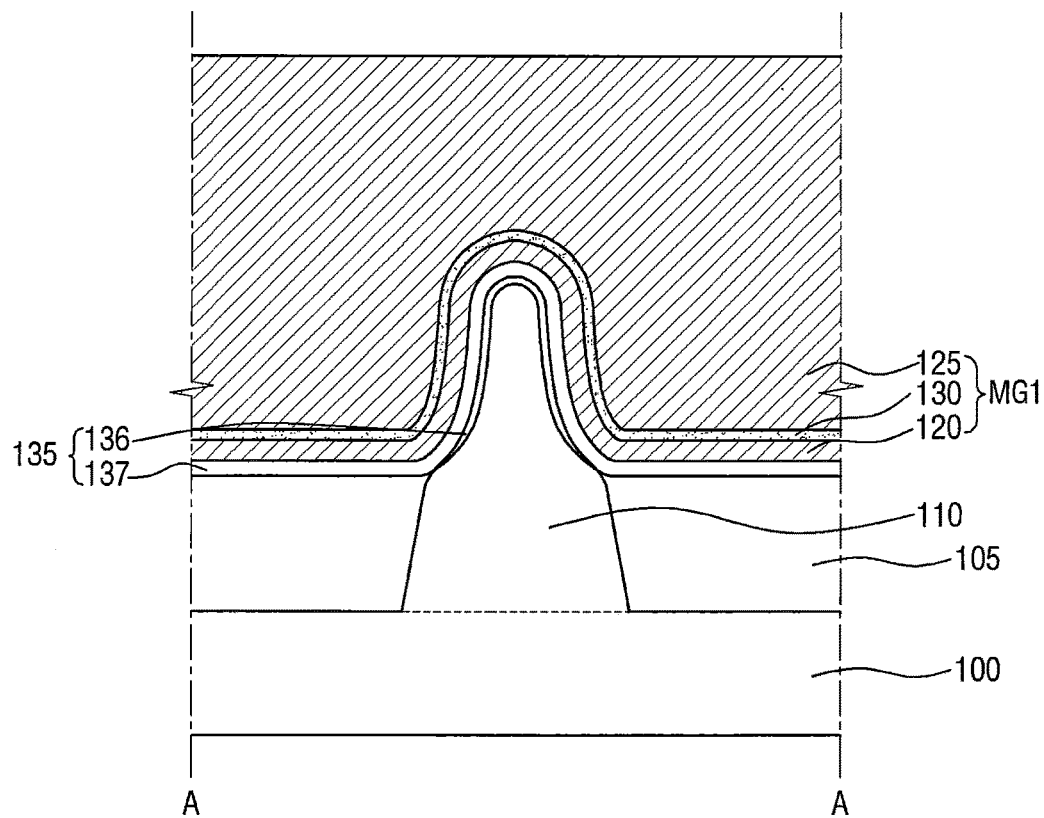
FIG. 7 is a cross-sectional view taken along the line A-A of FIG. 6.
Figure 8:
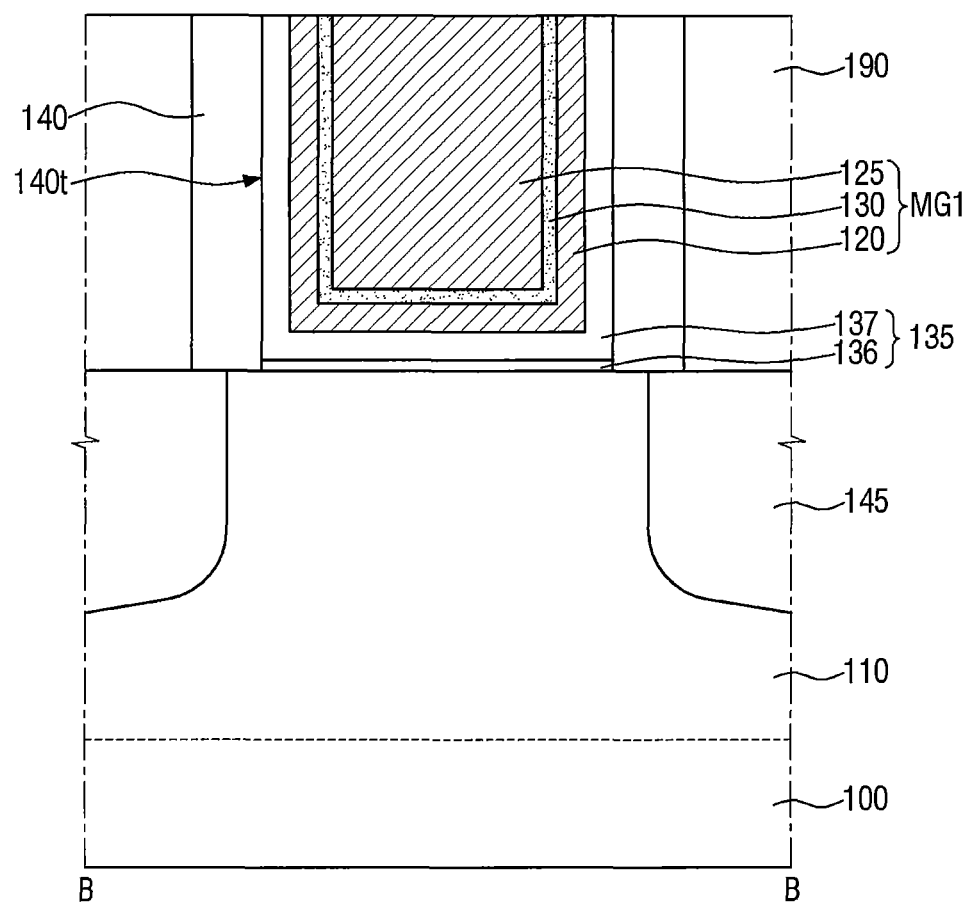
FIG. 8 is a cross-sectional view taken along the line B-B of FIG. 6.

FIG. 6 is a layout of a semiconductor device according to some example embodiments. FIG. 7 is a cross-sectional view taken along the line A-A of FIG. 6. FIG. 8 is a cross-sectional view taken along the line B-B of FIG. 6. For convenience of description, the following description will be made based on difference from the description with respect to FIG. 1.

Referring to FIGS. 6 to 8, the semiconductor device according to some example embodiments may include a first fin-type pattern 110, the first gate electrode structure MG1, the first gate spacer 140 and the first gate insulating film 135. It will be understood that the first fin-type pattern 110 refers to a fin-shaped active region.

The first fin-type pattern 110 may protrude from the substrate 100. Since the field insulating film 105 may be on a side surface of a lower portion of the first fin-type pattern 110, the first fin-type pattern 110 may protrude above the field insulating film 105 formed on the substrate 100. In some embodiments, the field insulating film 105 may expose an upper portion of the first fin-type pattern 110 as illustrated in FIG. 7.

The first fin-type pattern 110 in the field insulating film 105 may have a width decreasing as it becomes further from the upper surface of the substrate 100. Such a structure may reduce leakage current of the semiconductor device.

The first fin-type pattern 110 may extend in a first direction X1. The first fin-type pattern 110 may be a part of the substrate 100 and may include an epitaxial layer which grows from the substrate 100.

The first fin-type pattern 110 may include, for example, an element semiconductor material such as silicon or germanium. Further, the first fin-type pattern 110 may include a compound semiconductor such as, for example, IV-IV group compound semiconductor or III-V group compound semiconductor.

Specifically, for example, in case of the IV-IV group compound semiconductor, the first fin-type pattern may include a binary or ternary compound containing at least two of carbon (C), silicon (Si), germanium (Ge) and tin (Sn), or the aforementioned binary or ternary compound doped with a Group IV element.

For example, in case of the III-V group compound semi-conductor, the first fin-type pattern 110 may be a binary, ternary or quaternary compound composed of at least one group III element selected from aluminum (Al), gallium (Ga) and indium (In), and a Group V element selected from phosphorus (P), arsenic (As) and antimony (Sb).

The first gate spacer 140 may be formed on the first fin-type pattern 110 which protrudes from the field insulating film 105. The first gate spacer 140 may extend in a second direction Y1 and may cross the first fin-type pattern 110.

Since the first trench 140t is defined by the first gate spacer 140, it may extend in the second direction Y1.

The first gate insulating film 135 may be formed on the field insulating film 105 and the first fin-type pattern 110. The first gate insulating film 135 may be formed along the upper surface of the field insulating film 105 and a profile of the first fin-type pattern 110.

The first interfacial layer 136 may be formed on the first fin-type pattern 110. The first interfacial layer 136 may be formed along the profile of the first fin-type pattern 110 exposed by the field insulating film 105.

In some embodiments, the first interfacial layer 136 may not be formed on the upper surface of the field insulating film 105 as shown in FIG. 7, but not limited thereto. In some embodiments, according to a method of forming the first interfacial layer 136, the first interfacial layer 136 may be formed along the upper surface of the field insulating film 105 as well.

The first high-k insulating film 137 may be formed on the first interfacial layer 136 along the profile of the first fin-type pattern 110 and the upper surface of the field insulating film 105.

The first gate electrode structure MG1 may be formed on the first gate insulating film 135 and may cross the first fin-type pattern 110. That is, each of the first lower conductive film 120, the first insertion insulating film 130 and the first upper conductive film 125 may cross the first fin-type pattern 110.

The first lower conductive film 120 may be formed along the profile of the first gate insulating film 135 on the first high-k insulating film 137. In some embodiments, the first lower conductive film 120 may include a first barrier metal layer.

The first insertion insulating film 130 may be formed along the profile of the first lower conductive film 120 and on the first lower conductive film 120. The first insertion insulating film 130 may be formed along a profile of the first high-k insulating film 137. The first lower conductive film 120 may be formed between the first insertion insulating film 130 and the first high-k insulating film 137. In some embodiments, the first insertion insulating film 130 may directly contact the first lower conductive film 120. In some embodiment, the first insertion insulating film 130 may directly contact the first barrier metal layer of the first lower conductive film 120.

The first insertion insulating film 130 may be formed to be spaced apart from the first gate insulating film 135 (e.g., the first high-k insulating film 137.) The first insertion insulating film 130 may include a portion formed along the profile of the first fin-type pattern 110 which protrudes from the upper surface of the field insulating film 105 and a portion which extends along the upper surface of the field insulating film 105.

When the first interfacial layer 136 and the first insertion insulating film 130 include silicon oxide, the first high-k insulating film 137 and the first lower conductive film 120 may be disposed between silicon oxide films spaced apart from each other. The first high-k insulating film 137 and the first lower conductive film 120 may be extend along the profile of the first fin-type pattern 110 and the upper surface of the field insulating film 105 between the first interfacial layer 136 and the first insertion insulating film 130.

The first upper conductive film 125 may be formed on the first insertion insulating film 130.

The first source/drain region 145 may be formed within the first fin-type pattern 110. The first source/drain region 145 may include an epitaxial layer formed within or on the first fin-type pattern 110.

Figure 9:
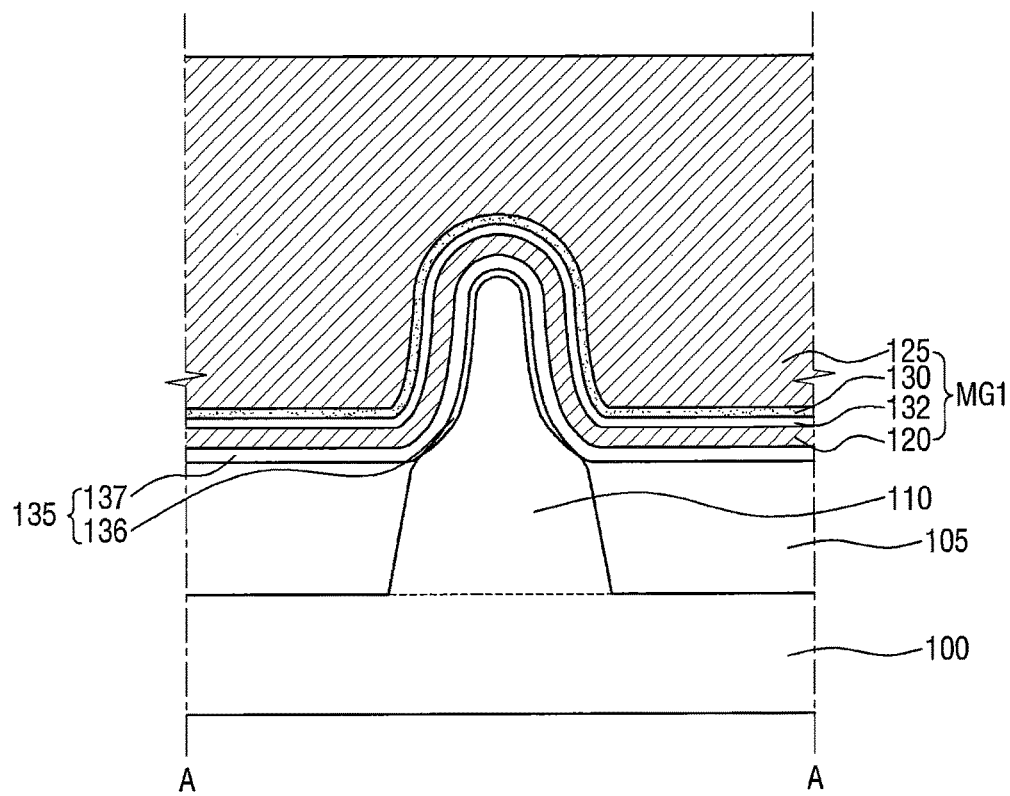
FIG. 9 is a cross-sectional view taken along the line A-A of FIG. 6.

FIG. 9 is a view illustrating a semiconductor device according to some example embodiments. For convenience of description, the following description will be made based on difference from the description with respect to FIGS. 6 to 8. FIG. 9 is a cross-sectional view taken along the line of A-A of FIG. 6.

Referring to FIG. 9, with respect to the semiconductor device according to some example embodiments, the first gate electrode structure MG1 may further include a first semiconductor liner 132 which extends along the profile of the first fin-type pattern 110 and the upper surface of the field insulating film 105.

The first semiconductor liner 132 may be formed between the first lower conductive film 120 and the first upper conductive film 125. The first semiconductor liner 132 may be formed between the first gate insulating film 135 and the first insertion insulating film 130.

Figure 10:
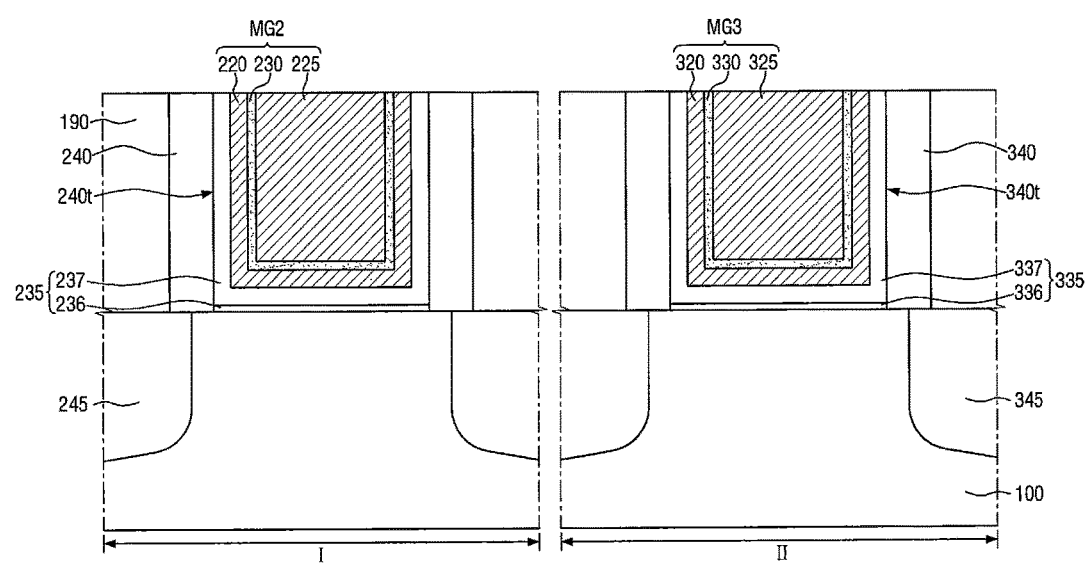
FIG. 10 is a view illustrating a semiconductor device according to some example embodiments.

FIG. 10 is a view illustrating a semiconductor device according to some example embodiments.

Referring to FIG. 10, the semiconductor device according to some example embodiments may include a second gate spacer 240, a second trench 240t, a second gate insulating film 235, a second gate electrode structure MG2, a third gate spacer 340, a third trench 340t, a third gate insulating film 335 and a third gate electrode structure MG3.

The substrate 100 may include a first region I and a second region II. The first region I and the second region II may be spaced apart from each other or may be connected to each other.

In some embodiments, a PMOS may be formed in the first region I, an NMOS may be formed in the second region II. In some embodiments, the NMOS may be formed in the first region I, and the PMOS may be formed in the second region II.

The second gate spacer 240 may be formed on the first region I of the substrate 100. The third gate spacer 340 may be formed on the second region II of the substrate 100.

The second trench 240t may be defined by the second gate spacer 240. The third trench 340t may be defined by the third gate spacer 340.

The interlayer insulating film 190 may surround an outer sidewall of the second gate spacer 240 and an outer sidewall of the third gate spacer 340. The interlayer insulating film 190 may include the second trench 240t and the third trench 340t.

The second gate insulating film 235 may be formed along a sidewall and a bottom surface of the second trench 240t. The second gate insulating film 235 may include a second interfacial layer 236 and a second high-k insulating film 237 sequentially stacked on the substrate 100.

The third gate insulating film 335 may be formed along a sidewall and a bottom surface of the third trench 340t. The third gate insulating film 335 may include a third interfacial layer 336 and a third high-k insulating film 337 sequentially stacked on the substrate 100.

The second interfacial layer 236 and the third interfacial layer 336 may be formed on the bottom surface of the second trench 240t and on the bottom surface of the third trench 340t, respectively. The second high-k insulating film 237 may be formed on the sidewall and bottom surface of the second trench 240t, and the third high-k insulating film 337 may be formed on the sidewall and bottom surface of the third trench 340t.

The second gate electrode structure MG2 may be formed on the second gate insulating film 235 and may be in the second trench 240t. In some embodiments, the second gate electrode structure MG2 may fill the second trench 240t.

The second gate electrode structure MG2 may include a second lower conductive film 220, a second insertion insulating film 230 and a second upper conductive film 225 sequentially stacked on the second gate insulating film 235. The second insertion insulating film 230 may be disposed between the second lower conductive film 220 and the second upper conductive film 225.

The second lower conductive film 220 may be formed along the profile of the second gate insulating film 235 on the second gate insulating film 235. The second lower conductive film 220 may be formed along the sidewall and bottom surface of the second trench 240t. The second lower conductive film 220 may include a second barrier metal layer.

The second insertion insulating film 230 may be formed on the second lower conductive film 220. The second insertion insulating film 230 may be formed along the sidewall and bottom surface of the second trench 240t. The second insertion insulating film 230 may be spaced apart from the second gate insulating film 235. In some embodiments, the second insertion insulating film 230 may directly contact the second lower conductive film 220. In some embodiments, the second insertion insulating film 230 may directly contact the second barrier metal layer of the second lower conductive film 220.

The second upper conductive film 225 may be formed on the second insertion insulating film 230. The second upper conductive film 225 may be formed along the sidewall and bottom surface of the second trench 240t.

The third gate electrode structure MG3 may be formed on the third gate insulating film 335 and may be in the third trench 340t. In some embodiments, the third gate electrode structure MG3 may fill the third trench 340t.

The third gate electrode structure MG3 may include a third lower conductive film 320, a third insertion insulating film 330 and a third upper conductive film 325 sequentially stacked on the third gate insulating film 335. The third insertion insulating film 330 may be disposed between the third lower conductive film 320 and the third upper conductive film 325.

The third lower conductive film 320 may be formed on the third gate insulating film 335. The third lower conductive film 320 may be formed along the sidewall and bottom surface of the third trench 340t. In some embodiments, the third lower conductive film 320 may include a third barrier metal layer.

The third insertion insulating film 330 may be formed on the third lower conductive film 320. The third insertion insulating film 330 may be formed along the sidewall and bottom surface of the third trench 340t. The third insertion insulating film 330 may be formed to be spaced apart from the third gate insulating film 335. In some embodiments, the third insertion insulating film 330 may directly contact the third lower conductive film 320. In some embodiments, the third insertion insulating film 330 may directly contact the third barrier metal layer of the third lower conductive film 320.

Each of the second insertion insulating film 230 and the third insertion insulating film 330 may include, for example, at least one of silicon oxide, silicon oxynitride, silicon nitride and germanium oxide.

The third upper conductive film 325 may be formed on the third insertion insulating film 330. The third upper conductive film 325 may be formed along the sidewall and bottom surface of the third trench 340*t*.

A second source/drain region 245 may be formed adjacent to the second gate electrode structure MG2, and a third source/drain region 345 may be formed adjacent to the third gate electrode structure MG3.

Figure 11:
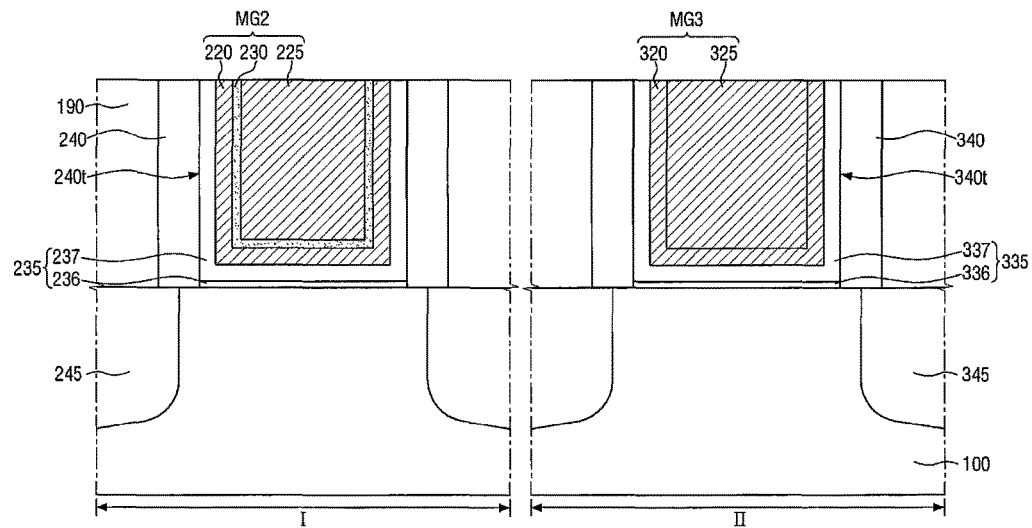
FIG. 11 is a view illustrating a semiconductor device according to some example embodiments.

FIG. 11 is a view illustrating a semiconductor device according to some example embodiments. For convenience of description, the following description will be made based on difference from the description with respect to FIG. 10.

Referring to FIG. 11, the third gate electrode structure MG3 may not include an insertion insulating film between the third lower conductive film 320 and the third upper conductive film 325.

That is, the third gate electrode structure MG3 may have a structure in which an insertion film including an insulating material is not formed between the third lower conductive film 320 and the third upper conductive film 325.

However, the second gate electrode structure MG2 may include the second insertion insulating film 230 formed between the second lower conductive film 220 and the second upper conductive film 225.

In this case, the thickness of the second lower conductive film 220 may be substantially equal to that of the third lower conductive film 320.

However, the third gate electrode structure MG3 does not include an insertion insulating film. Accordingly, if a width of the second trench 240*t* is substantially equal to that of the third trench 340*t*, the thickness of the third upper conductive film 325 on the sidewall of the third trench 340*t* may be greater than that of the second upper conductive film 225 on the sidewall of the second trench 240*t*.

Figure 12:
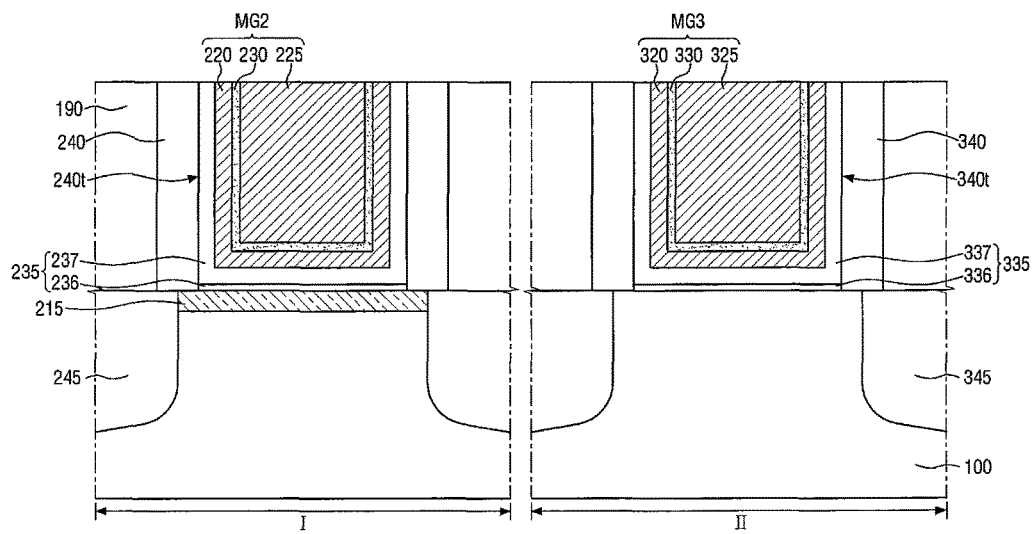
FIG. 12 is a view illustrating a semiconductor device according to some example embodiments.

FIG. 12 is a view illustrating a semiconductor device according to some example embodiments. For convenience of description, the following description will be made based on difference from the description with respect to FIG. 10.

Referring to FIG. 12, the semiconductor device according to some example embodiments may further include a second channel layer 215 between the second gate electrode structure MG2 and the substrate 100.

The second channel layer 215 may be formed between the substrate 100 and the second gate insulating film 235. The second channel layer 215 may be formed on the upper surface of the substrate 100.

The second channel layer 215 may include a material having a different lattice constant from that of the substrate 100. In some embodiments, a PMOS may be formed in the first region I, the substrate 100 may be a silicon substrate, and the second channel layer 215 may include silicon germanium.

In some embodiments, the channel layer may not be formed in the second region II, as shown in FIG. 12.

That is, a channel layer which includes a material having a different lattice constant from that of the substrate 100 may be formed in both the first region I and the second region II.

When the substrate 100 includes silicon germanium, a PMOS is formed in the first region I and an NMOS is formed in the second region II, the channel layer formed in the first region I may include a material having a greater lattice constant than that of the substrate 100 and the channel layer formed in the second region II may include a material having a less lattice constant than that of the substrate 100.

In some embodiments, the channel layer formed in the first region I and the second region II may include silicon germanium having a different germanium concentration from that of silicon germanium of the substrate 100.

Figure 13:
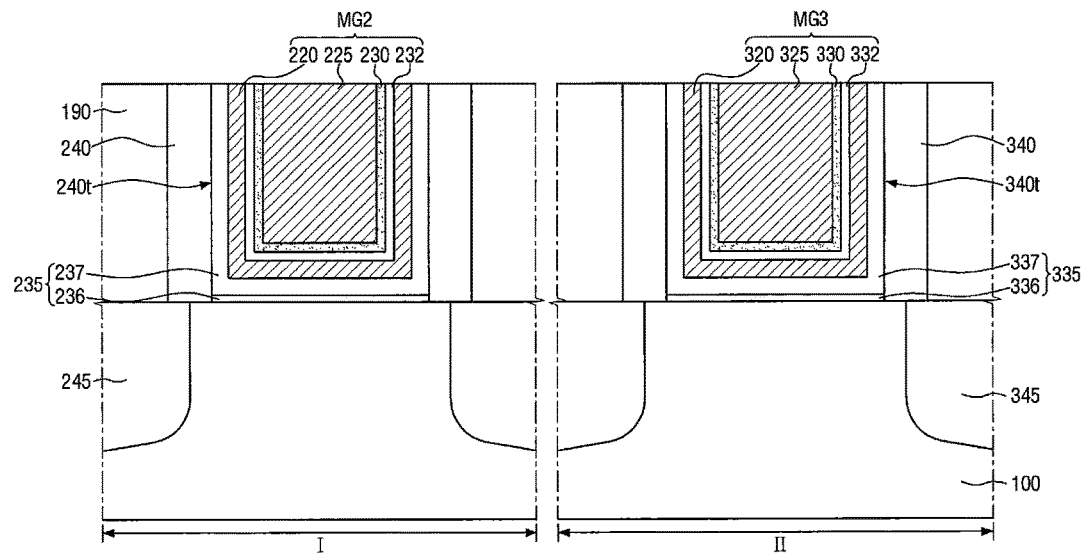
FIG. 13 is a top view illustrating a semiconductor device according to some example embodiments.

FIG. 13 is a view illustrating a semiconductor device according to some example embodiments. For convenience of description, the following description will be made based on difference from the description with respect to FIG. 10.

Referring to FIG. 13, the second gate electrode structure MG2 may further include a second semiconductor liner 232 and the third gate electrode structure MG3 may further include a third semiconductor liner 332.

The second semiconductor liner 232 may be formed between the second lower conductive film 220 and the second upper conductive film 225. The second semiconductor liner 232 may be formed between the second gate insulating film 235 and the second insertion insulating film 230. The second semiconductor liner 232 may be formed between the second insertion insulating film 230 and the second lower conductive film 220.

The second semiconductor liner 232 may be formed on the second lower conductive film 220. The second semiconductor liner 232 may be formed along the sidewall and bottom surface of the second trench 240*t*. In some embodiments, the second semiconductor liner 232 may directly contact the second lower conductive film 220. In some embodiments, the second semiconductor liner 232 may directly contact the second barrier metal layer of the second lower conductive film 220.

The third semiconductor liner 332 may be formed between the third lower conductive film 320 and the third upper conductive film 325. The third semiconductor liner 332 may be formed between the third gate insulating film 335 and the third insertion insulating film 330. The third semiconductor liner 332 may be formed between the third insertion insulating film 330 and the third lower conductive film 320.

The third semiconductor liner 332 may be formed on the third lower conductive film 320. The third semiconductor liner 332 may be formed along the sidewall and bottom surface of the third trench 340*t*. In some embodiments, the third semiconductor liner 332 may directly contact the third lower conductive film 320. In some embodiments, the third semiconductor liner 332 may directly contact the third barrier metal layer of the third lower conductive film 320.

The second semiconductor liner 232 may be formed to be spaced apart from the second gate insulating film 235, and the third semiconductor liner 332 may be formed to be spaced apart from the third gate insulating film 335. The second semiconductor liner 232 may not contact the second gate insulating film 235, and the third semiconductor liner 332 may not contact the third gate insulating film 335.

In some embodiments, each of the second semiconductor liner 232 and the third semiconductor liner 332 may include a semiconductor material. Each of the second semiconductor liner 232 and the third semiconductor liner 332 may include, for example, at least one of a silicon film, a silicon germanium film and a germanium film.

Figure 14:
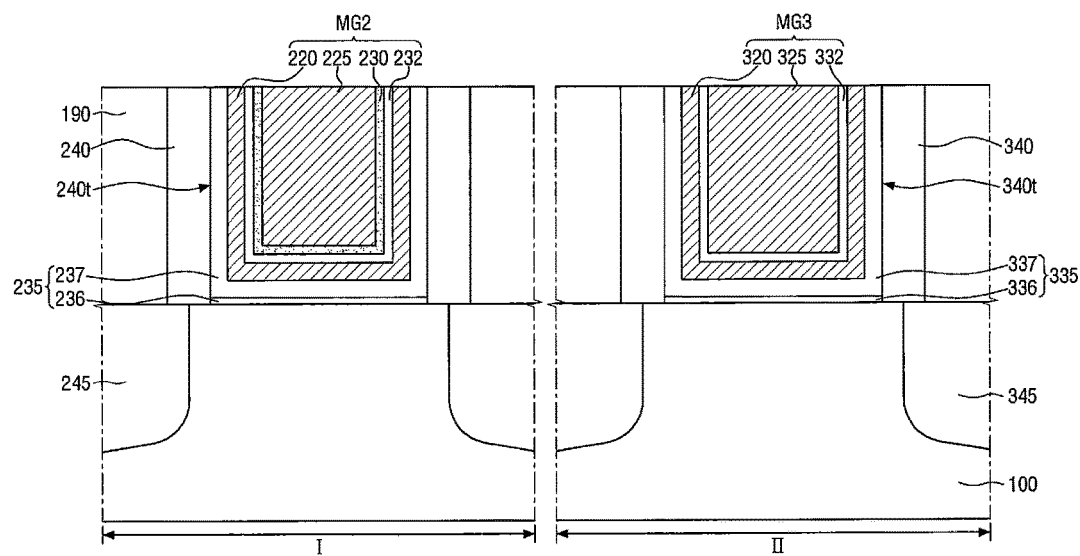
FIG. 14 is a view illustrating a semiconductor device according to some example embodiments.

FIG. 14 is a view illustrating a semiconductor device according to some example embodiments. For convenience of description, the following description will be made based on difference from the description with respect to FIG. 13.

Referring to FIG. 14, the third gate electrode structure MG3 may not include an insertion insulating film between the third lower conductive film 320 and the third upper conductive film 325.

That is, the third gate electrode structure MG3 may have a structure in which the third lower conductive film 320, the third semiconductor liner 332 and the third upper conductive film 325 are sequentially stacked on the substrate 100. The third semiconductor liner 332 may be formed between the third lower conductive film 320 and the third upper conductive film 325, whereas the insertion insulating film may be not formed therebetween.

Figure 15:
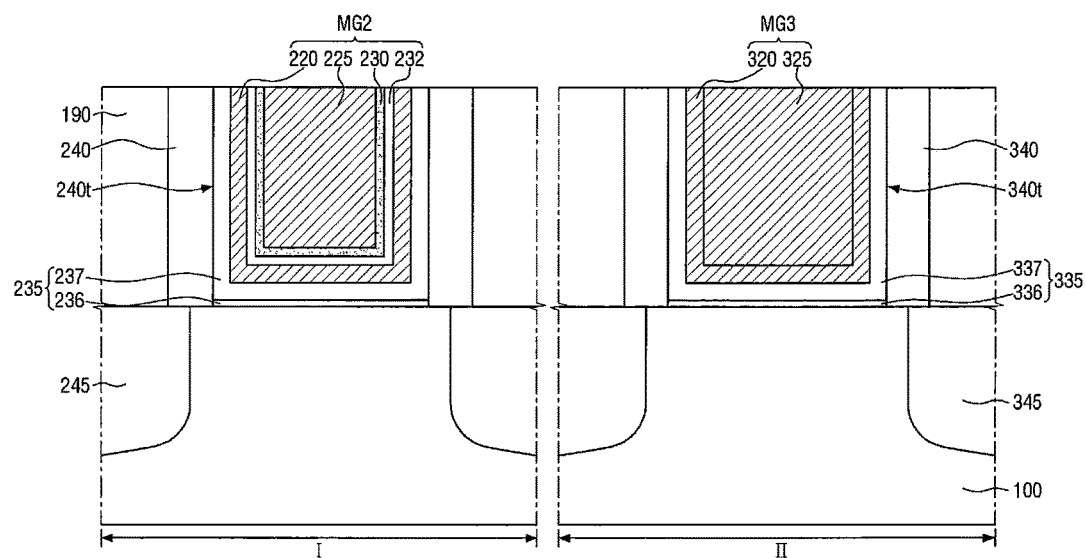
FIG. 15 is a view illustrating a semiconductor device according to some example embodiments.

FIG. 15 is a view illustrating a semiconductor device according to some example embodiments. For convenience of description, the following description will be made based on difference from the description with respect to FIG. 13.

Referring to FIG. 15, in the semiconductor device according to some example embodiments, the third gate electrode structure MG3 may include neither an insertion insulating film nor a semiconductor liner between the third lower conductive film 320 and the third upper conductive film 325.

That is, the third gate electrode structure MG3 may have a structure in which neither an insertion film including an insulating material nor a liner including a semiconductor material are formed between the third lower conductive film 320 and the third upper conductive film 325.

Figure 16:
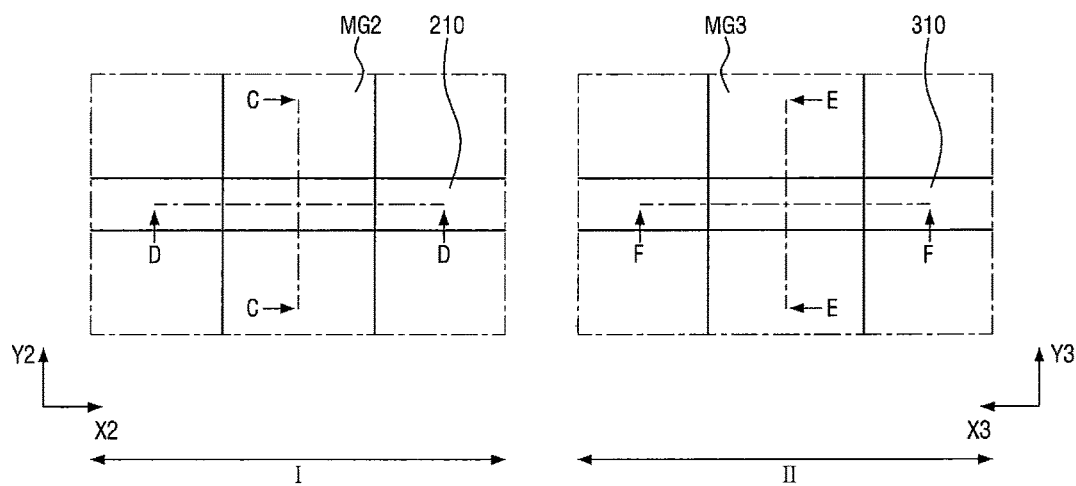
FIG. 16 is a layout of a semiconductor device according to some example embodiments.
Figure 17:
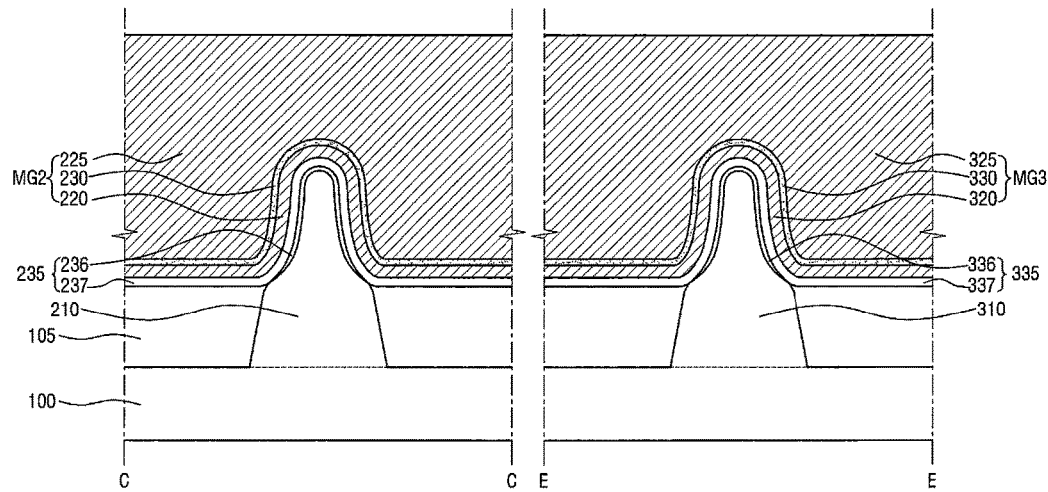
FIG. 17 is a cross-sectional view taken along lines the C-C and E-E of FIG. 16.
Figure 18:
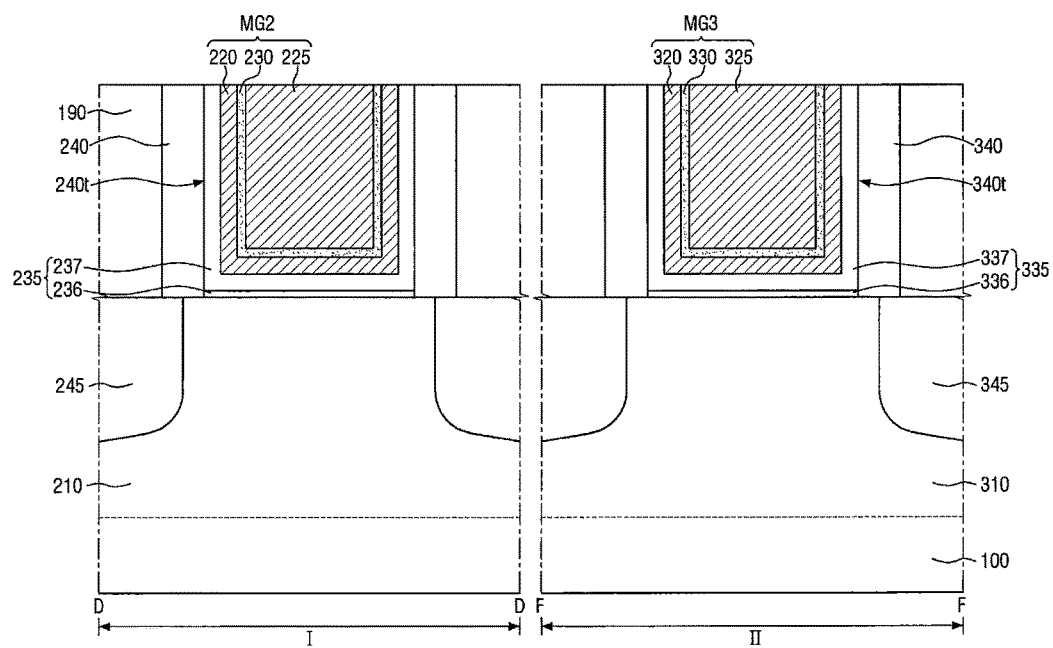
FIG. 18 is a cross-sectional view taken along lines the D-D and F-F of FIG. 16.

FIG. 16 is a layout of a semiconductor device according to some example embodiments. FIG. 17 is a cross-sectional view taken along the lines C-C and E-E of FIG. 16. FIG. 18 is a cross-sectional view taken along the lines D-D and F-F of FIG. 16. For convenience of description, the following description will be made based on difference from the description with respect to FIG. 10.

Referring to FIGS. 16 to 18, the semiconductor device according to some example embodiments may include a second fin-type pattern 210 and a third fin-type pattern 310.

The second fin-type pattern 210 may protrude from the first region I of the substrate 100. The third fin-type pattern 310 may protrude from the second region II of the substrate 100.

Since the field insulating film 105 is on lower portions of the second fin-type pattern 210 and the third fin-type pattern 310, the second fin-type pattern 210 and the third fin-type pattern 310 may protrude from an upper surface of the field insulating film 105 formed on the substrate 100. The field insulating film 105 may expose upper portions of the second fin-type pattern 210 and the third fin-type pattern 310.

The second fin-type pattern 210 may extend in a third direction X2. The third fin-type pattern 310 may extend in a fifth direction X3.

The second gate electrode structure MG2 may extend in a fourth direction Y2. The second gate electrode structure MG2 may be formed on the second gate insulating film 235 and may cross the second fin-type pattern 210. Each of the second lower conductive film 220, the second insertion insulating film 230 and the second upper conductive film 225 may cross the second fin-type pattern 210.

The third gate electrode structure MG3 may extend in a sixth direction Y3. The third gate electrode structure MG3 may be formed on the third gate insulating film 335 and may cross the third fin-type pattern 310. Each of the third lower conductive film 320, the third insertion insulating film 330 and the third upper conductive film 325 may cross the third fin-type pattern 310.

The second and third gate electrode structures MG2 and MG3 are substantially similar to the first gate electrode structure MG1 described with respect to FIGS. 6 to 8. In addition, the description with respect to the second and third gate insulating films 235 and 335 is substantially similar to that of the first gate insulating film 135 with respect to FIGS. 6 to 8.

Figure 19:
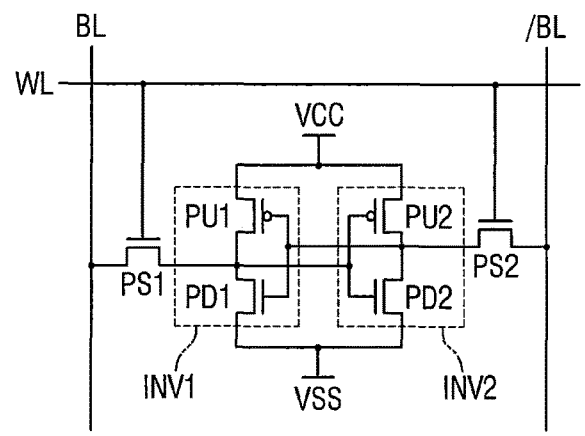
FIG. 19 is a circuit diagram illustrating a semiconductor device according to some example embodiments.
Figure 20:
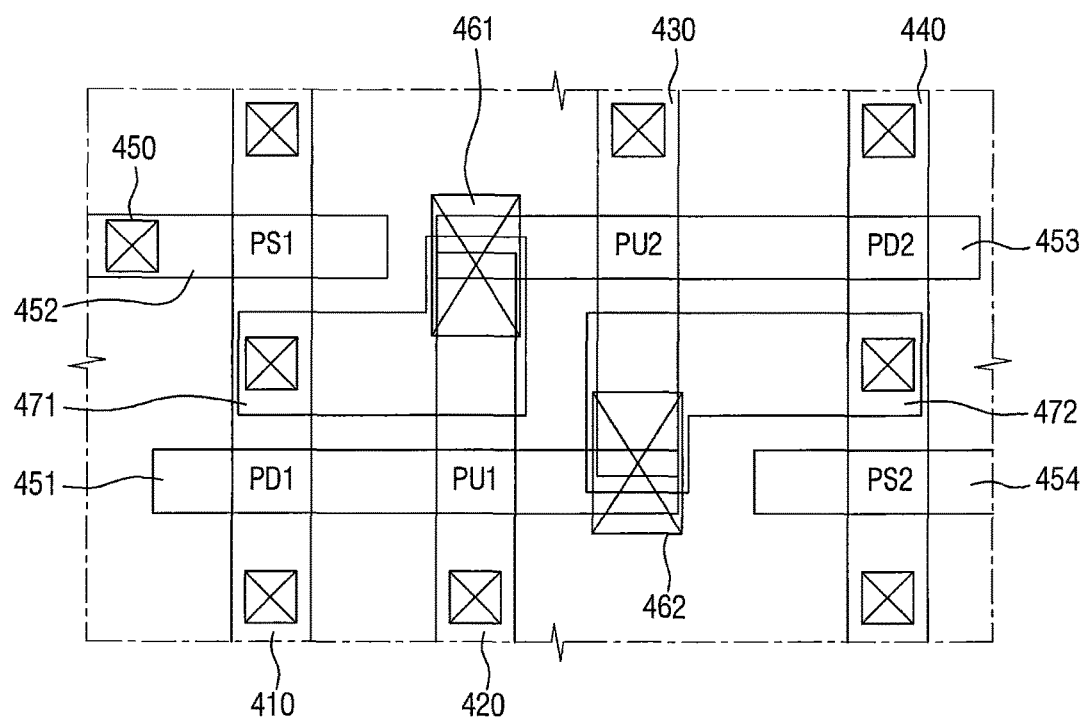
FIG. 20 is a layout of the semiconductor device of FIG. 19.

FIG. 19 is a circuit diagram illustrating a semiconductor device according to some example embodiments. FIG. 20 is a layout of the semiconductor device of FIG. 19.

Referring to FIG. 19, the semiconductor device may include a pair of inverters INV1 and INV2 connected to each other in parallel between a power supply node Vcc and a ground node Vss, and a first pass transistor PS1 and a second pass transistor PS2 respectively connected to output nodes of the inverters INV1 and INV2. The first pass transistor PS1 and the second pass transistor PS2 may be connected to a bit line BL and a complementary bit line /BL, respectively. The gates of the first pass transistor PS1 and the second pass transistor PS2 may be connected to a word line WL.

The first inverter INV1 includes a first pull-up transistor PU1 and a first pull-down transistor PD1 connected in series, and the second inverter INV2 includes a second pull-up transistor PU2 and a second pull-down transistor PD2 connected in series. The first pull-up transistor PU1 and the second pull-up transistor PU2 may be PFET transistors, and the first pull-down transistor PD1 and the second pull-down transistor PD2 may be NFET transistors.

Further, in order for the first inverter INV1 and the second inverter INV2 to construct one latch circuit, the input node of the first inverter INV1 may be connected to the output node of the second inverter INV2, and the input node of the second inverter INV2 may be connected to the output node of the first inverter INV1.

Referring to FIGS. 19 and 20, a first active region 410, a second active region 420, a third active region 430 and a fourth active region 440 which are spaced apart from one another may be formed to extend in a first direction (for example, a vertical direction of FIG. 20). The second active region 420 and the third active region 430 may be shorter than the first active region 410 and the fourth active region 440.

In addition, a first gate line 451, a second gate line 452, a third gate line 453 and a fourth gate line 454 may be formed to extend in a second direction (for example, in a horizontal direction of FIG. 20) that is different from the first direction and may cross the first to fourth active regions 410 to 440.

Specifically, the first gate line 451 may entirely cross the first active region 410 and the second active region 420 and may partially overlap an end of the third active region 430. The third gate line 453 may entirely cross the fourth active region 440 and the third active region 330 and may partially overlap an end of the second active region 420. The second gate line 452 and the fourth gate line 454 may be formed to cross the first active region 410 and the fourth active region 340, respectively.

As shown in FIG. 20, the first pull-up transistor PU1 may be defined near an overlapping region between the first gate line 451 and the second active region 420, the first pull-down transistor PD1 may be defined near an overlapping region between the first gate line 451 and the first active region 410, and the first pass transistor PS1 may be defined near an overlapping region between the second gate line 452 and the first active region 410.

The second pull-up transistor PU2 may be defined near an overlapping region between the third gate line 453 and the third active region 430, the second pull-down transistor PD2 may be defined near an overlapping region between the third gate line 453 and the fourth active region 440, and the second pass transistor PS2 may be defined near an overlapping region between the fourth gate line 454 and the fourth active region 440.

Although not clearly shown, sources/drains may be formed at both sides of respective overlapping regions between the first to fourth gate lines 451 to 454 and the first to fourth active regions 410, 420, 430 and 440, and a plurality of contacts 450 may be also formed in the overlapping regions.

Besides, a first shared contact 461 connects the second active region 420, the third gate line 453 and a wiring 471 to one another. A second shared contact 462 connects the third active region 430, the first gate line 451 and a wiring 472 to one another.

At least one of the semiconductor devices according to some example embodiments may be included in an SRAM illustrated in FIGS. 19 and 20.

FIGS. 21 through 26 are views illustrating a method of fabricating a semiconductor device according to some example embodiments.

Figure 21:
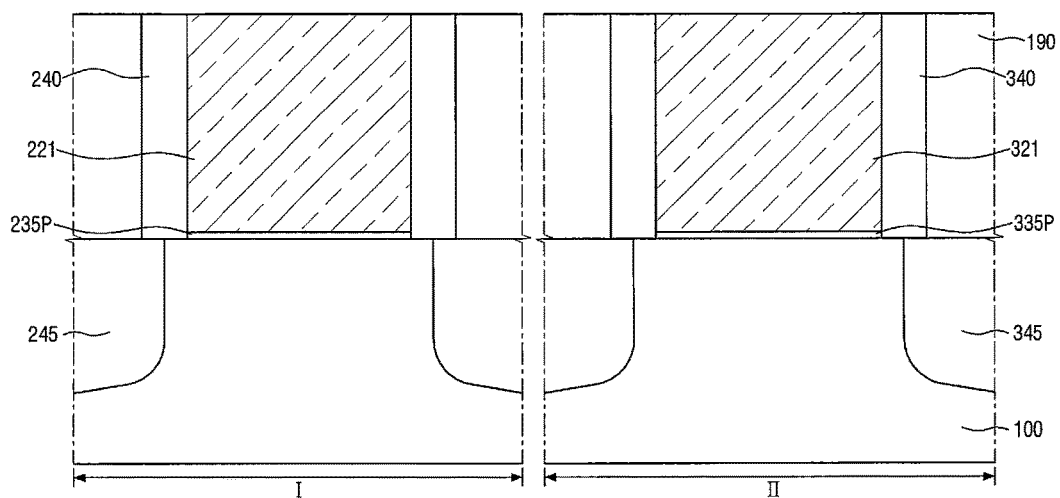
FIGS. 21 through 26 are views illustrating a method of fabricating a semiconductor device according to some example embodiments.

FIGS. 21 through 26 illustrate a process of fabricating a semiconductor device on a substrate including two regions (e.g., first region I and second region II in FIG. 21).

Referring to FIG. 21, a first dummy gate insulating film 235P and a first dummy gate electrode 221 may be formed such that they are sequentially stacked on a first region I of a substrate 100. In addition, a second dummy gate insulating film 335P and a second dummy gate electrode 321 may be formed such that they are sequentially stacked on a second region II of the substrate 100.

The first dummy gate insulating film 235P and the second dummy gate insulating film 335P may include, for example, silicon oxide, silicon oxynitride and a combination thereof. Each of the first dummy gate electrode 221 and the second dummy gate electrode 321 may include, for example, silicon, and more specifically one of polycrystalline silicon (poly Si), amorphous silicon (a-Si) and a combination thereof. The first dummy gate electrode 221 and the second dummy gate electrode 321 may be doped or not doped with impurities.

A second gate spacer 240 may be formed on a sidewall of the first dummy gate electrode 221 and a third gate spacer 340 may be formed on a sidewall of the second dummy gate electrode 321.

After formation of the second gate spacer 240 and the third gate spacer 340, a second source/drain region 245 may be formed adjacent to the first dummy gate electrode 221 and a third source/drain region 345 may be formed adjacent to the second dummy gate electrode 321, respectively.

An interlayer insulating film 190 may be formed on the substrate 100 such that it covers the first dummy gate electrode 221 and the second dummy gate electrode 321.

The interlayer insulating film 190 may be planarized to expose an upper surface of the first dummy gate electrode 221, an upper surface of the second dummy gate electrode 321, the second gate spacer 240 and the third gate spacer 340.

Figure 22:
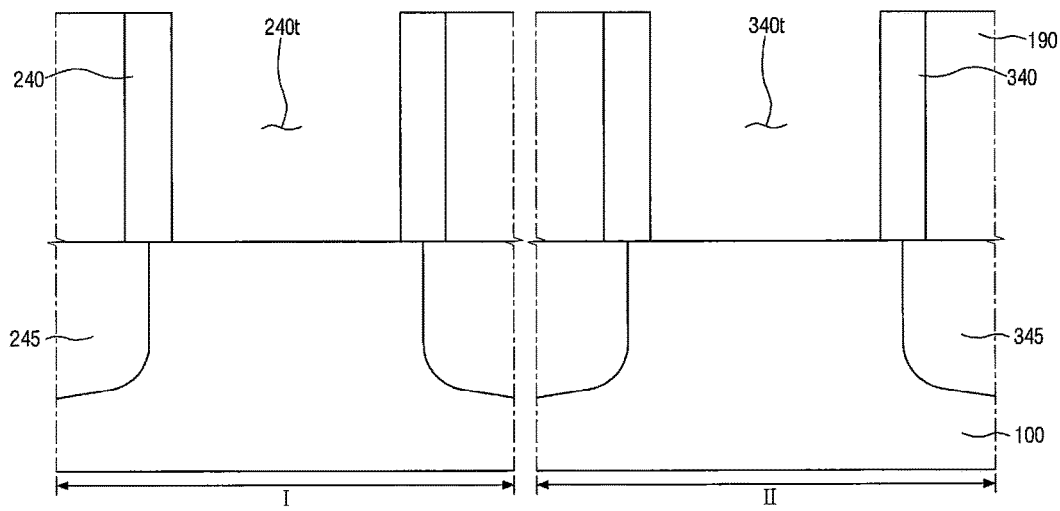

Referring to FIG. 22, the first dummy gate electrode 221 and the second dummy gate electrode 321 may be removed. After removal of the first dummy gate electrode 221 and the second dummy gate electrode 321, the first dummy gate insulating film 235P and the second dummy gate insulating film 335P may be removed to form a second trench 240t and a third trench 340t. The second trench 240t and the third trench 340t may expose the upper surface of the substrate 100.

The interlayer insulating film 190 may include the second trench 240t defined by the second gate spacer 240 and the third trench 340t defined by the third gate spacer 340.

The first dummy gate electrode 221 and the second dummy gate electrode 321 may be removed using a wet process and/or a dry process. In some embodiments, a wet-etching process is used, and the first dummy gate electrode 221 and the second dummy gate electrode 321 may be substantially removed by exposing them to an aqueous solution containing a hydroxide source at a sufficient temperature for a sufficient time. The hydroxide source may include ammonium hydroxide or tetraalkyl ammonium hydroxide, for example, tetramethyl ammonium hydroxide (TMAH), but not limited thereto.

In some embodiments, the first dummy gate insulating film 235P and the second dummy gate insulating film 335P may be removed by a wet-etching process and/or a dry-etching process. An etching solution or an etching gas may be varied depending on materials of the first dummy gate insulating film 235P and the second dummy gate insulating film 335P.

Figure 23:
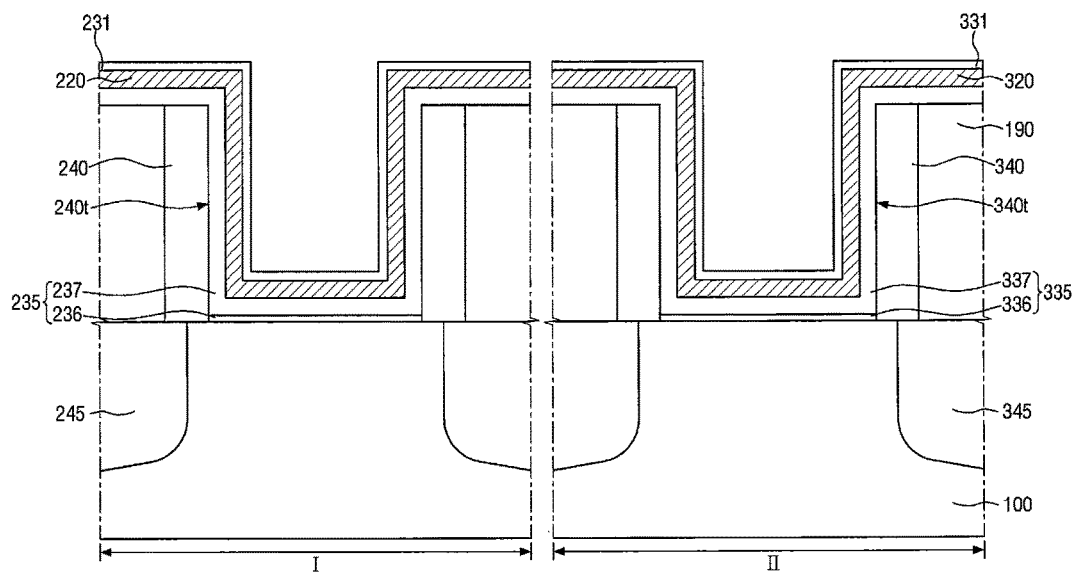

Referring to FIG. 23, a second gate insulating film 235 and a third gate insulating film 335 may be formed on the substrate 100. The second gate insulating film 235 may be formed on a sidewall and/or a bottom surface of the second trench 240t and the third gate insulating film 335 may be formed on a sidewall and/or a bottom surface of the third trench 340t.

A second interfacial layer 236 may be formed on the bottom surface of the second trench 240t and a third interfacial layer 336 may be formed on the bottom surface of the third trench 340t. When the substrate 100 includes silicon, each of the second interfacial layer 236 and the third interfacial layer 336 may include a silicon oxide film.

The second high-k insulating film 237 may be formed on the second interfacial layer 236. The second high-k insulating film 237 may be formed on the sidewall or the bottom surface of the second trench 240t. The second high-k insulating film 237 may be formed on the upper surface of the interlayer insulating film 190 as well.

The third high-k insulating film 337 may be formed on the third interfacial layer 336. The third high-k insulating film 337 may be formed on the sidewall and the bottom of the third trench 340t. The third high-k insulating film 337 may be formed on an upper surface of the interlayer insulating film 190 as well.

A second lower conductive film 220 may be formed on the second gate insulating film 235 and a third lower conductive film 320 may be formed on the third gate insulating film 335.

Referring to FIG. 23, the second lower conductive film 220 may be formed not only on the sidewall and the bottom surface of the second trench 240t, but also on the upper surface of the interlayer insulating film 190. The third lower conductive film 320 may be formed not only on the sidewall and the bottom surface of the trench 340t, but also on the upper surface of the interlayer insulating film 190.

In some embodiments, the second lower conductive film 220 may include a second barrier metal layer, and the third lower conductive film 320 may include a third barrier metal layer. Each of the second and third barrier metal layers may include, for example, titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN) and/or oxidized material thereof (e.g., titanium oxynitride, tantalum oxynitride.)

A first semiconductor film 231 may be formed on the second lower conductive film 220 and a second semiconductor film 331 may be formed on the third lower conductive film 320. In some embodiments, the first semiconductor film 231 may directly contact the second barrier metal layer of the second lower conductive film 220, and the second semiconductor film 331 may directly contact the third barrier metal layer of the third lower conductive film 320.

The first semiconductor film 231 may be formed not only on the sidewall and the bottom surface of the second trench 240t, but also on the upper surface of the interlayer insulating film 190. The second semiconductor film 331 may be formed not only on the sidewall and the bottom surface of the third trench 340t, but also on the upper surface of the interlayer insulating film 190.

The first semiconductor film 231 and the second semiconductor film 331 may include, for example, at least one of a silicon film, a silicon germanium film and a germanium film.

In some embodiments, the second lower conductive film 220 and the first semiconductor film 231 may be formed in-situ, and the third lower conductive film 320 and the second semiconductor film 331 may be formed in-situ. It will be understood that "forming a film A and a film B on a substrate in-situ" (or similar language) means that the film A and the film B are formed on the substrate in one chamber of an equipment without transferring the substrate out of the chamber or the film A and the film B are formed on the substrate in one equipment without transferring the substrate out of the equipment such that the substrate is not exposed to oxygen while the film A and the film B are formed. Accordingly, it will be also understood that, in some embodiments, "forming a film A and a film B on a substrate in-situ" (or similar language) means that the film A and the film B are formed without exposing the substrate to oxygen.

Figure 24A:
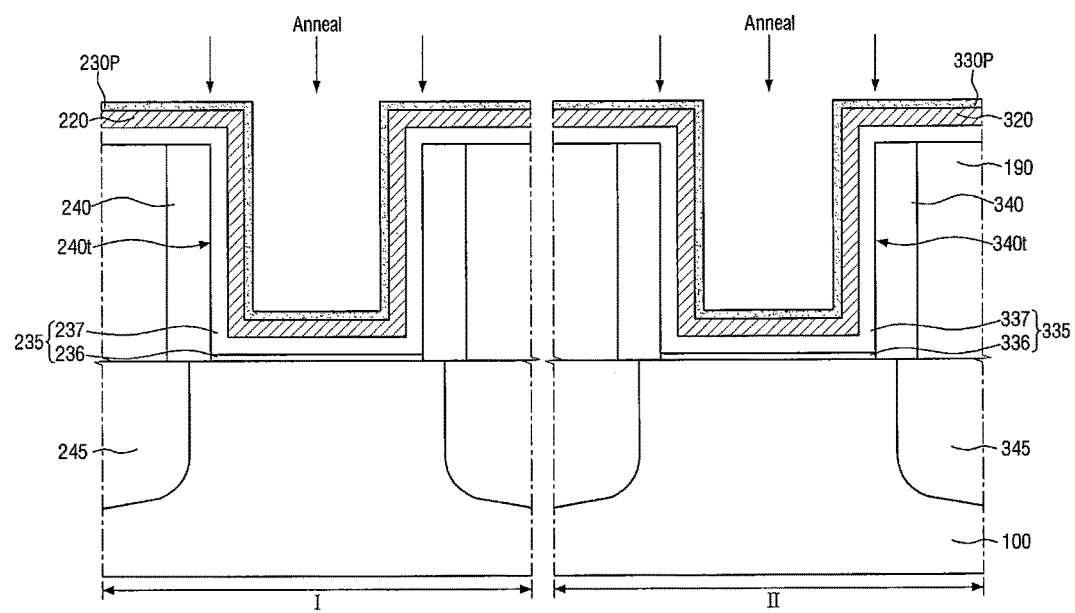

Referring to FIG. 24A, in some embodiments, the first semiconductor film 231 may be oxidized to form a first pre-insertion insulating film 230P, and the second semiconductor film 331 may be oxidized to form a second pre-insertion insulating film 330P.

Figure 24B:
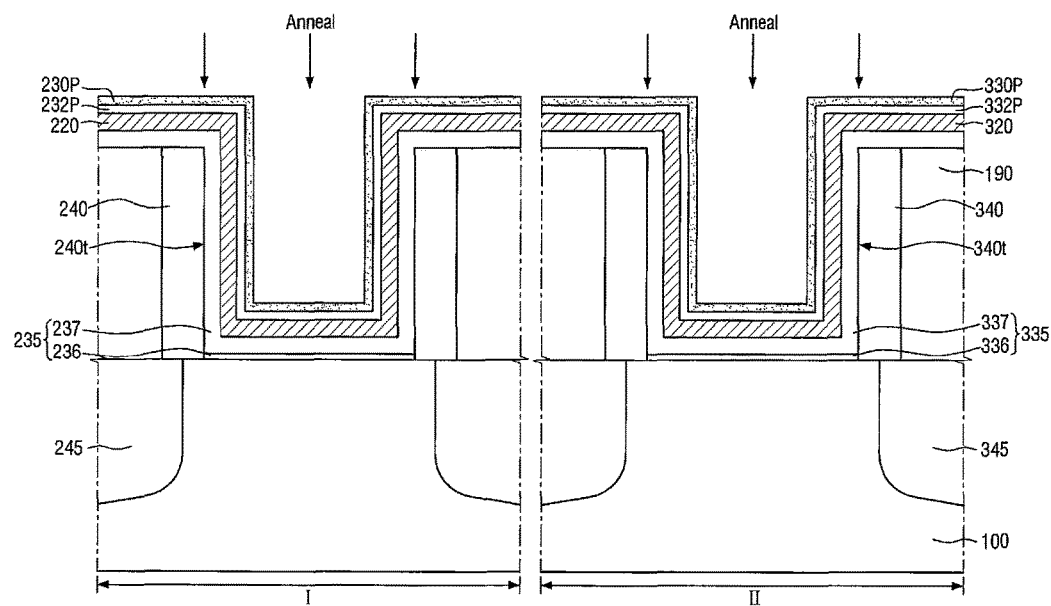

In some embodiments, as illustrated in FIG. 24B, only an upper portion of the first semiconductor film 231 may be oxidized to form a first pre-insertion insulating film 230P, and a lower portion of the first semiconductor film 231 may remain between the first pre-insertion insulating film 230P and the second lower conductive film 220 after oxidizing the first semiconductor film 231. The lower portion of the first semiconductor film 231 may be referred to as a first pre-semiconductor liner 232P. In some embodiments, only an upper portion of the second semiconductor film 331 may be oxidized to form a second pre-insertion insulating film 330P and a lower portion of the second semiconductor film 331 may remain between the second pre-insertion insulating film 330P and the third lower conductive film 320. The lower portion of the second semiconductor film 331 may be referred to as a second pre-semiconductor liner 332P.

Referring to FIGS. 24A and 24B, the second lower conductive film 220 and the second gate insulating film 235 may be heat-treated using the first pre-insertion insulating film 230P as a mask and the third lower conductive film 320 and the third gate insulating film 335 may be heat-treated using the second pre-insertion insulating film 330P as a mask. The second lower conductive film 220 and the second gate insulating film 235 may be heat-treated while the first pre-insertion insulating film 230P is exposed, and the third lower conductive film 320 and the third gate insulating film 335 may be heat-treated while the second pre-insertion insulating film 330P is exposed.

In some embodiments, the oxidization of the first semiconductor film 231 and the second semiconductor film 331 and the heat treatment may be simultaneously performed, but the present disclosure is not limited thereto.

Figure 25:
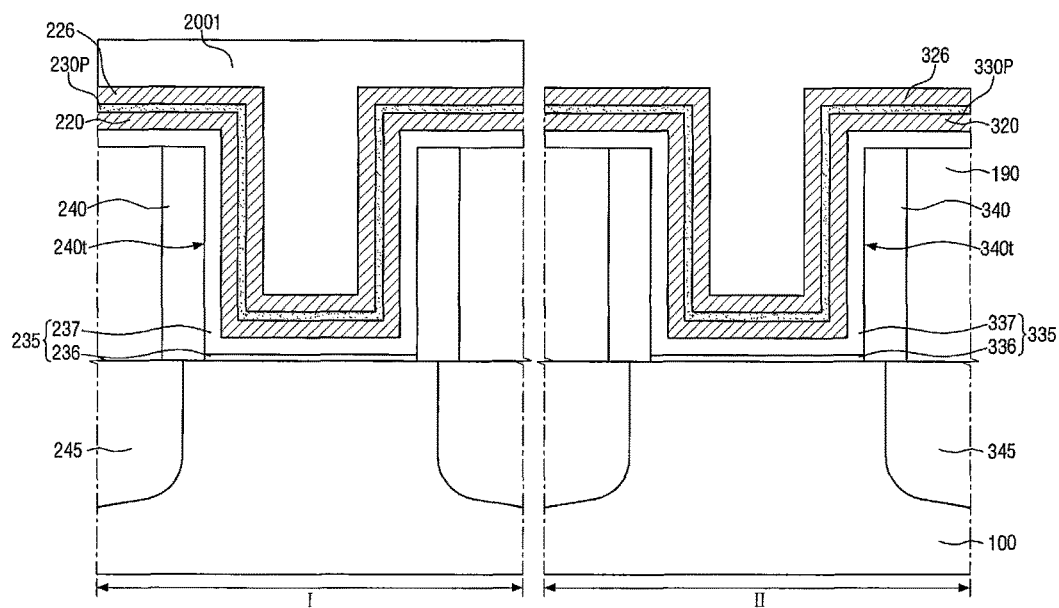

Referring to FIG. 25, a first conductive film 226 may be formed on the first pre-insertion insulating film 230P and a second conductive film 326 may be formed on the second pre-insertion insulating film 330P.

The first conductive film 226 may be formed not only on the sidewall and the bottom surface of the second trench 240t, but also on the upper surface of the interlayer insulating film 190. The second conductive film 326 may be formed not only on the sidewall and the bottom surface of third trench 340t, but also on the upper surface of the interlayer insulating film 190.

The first and second conductive films 226 and 326 may include the material included in the first upper conductive film 125 described with respect to FIG. 1.

A mask pattern 2001 may be formed on the first region I. The mask pattern 2001 may expose the second conductive film 326 formed on the second region II.

Figure 26:
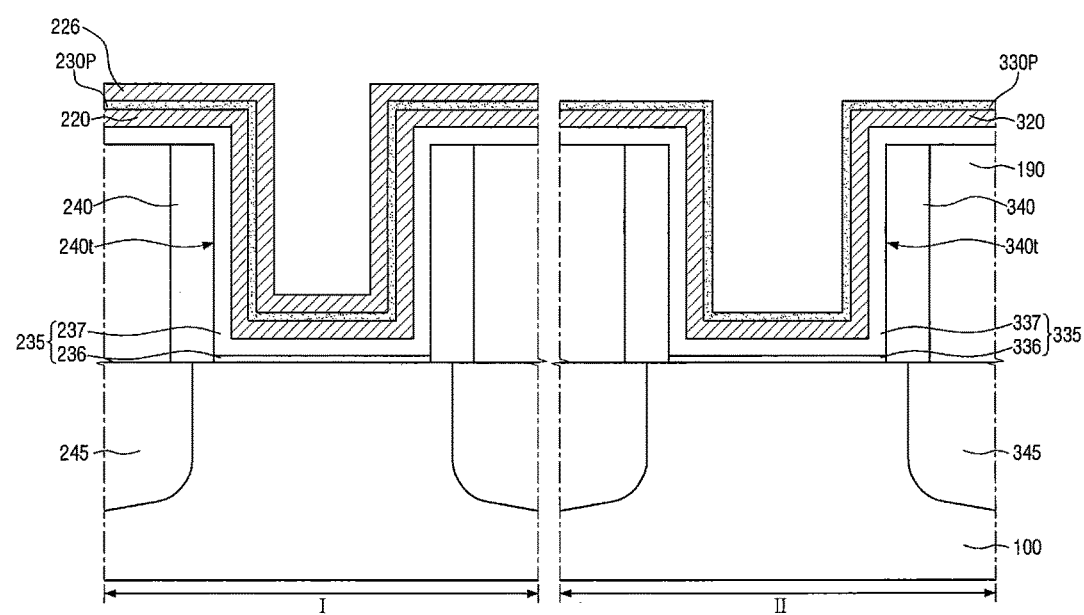

Referring to FIGS. 10 and 26, the second conductive film 326 may be removed using the mask pattern 2001 as an etching mask.

The second pre-insertion insulating film 330P disposed under the second conductive film 326 may be used as an etch stopping layer for removal of the second conductive film 326. The first conductive film 226 remaining on the first region I may be a portion of the second upper conductive film 225 shown in FIG. 10.

The mask pattern 2001 formed on the first region I may be removed.

A remaining of the second upper conductive film 225 may be formed on the first conductive film 226 of the first region I and a third upper conductive film 325 may be formed on the second pre-insertion insulating film 330P of the second region II as illustrated in, for example, FIG. 10.

Next, to expose the upper surface of the interlayer insulating film 190, the second and third high-k insulating films 237 and 337, the second and third lower conductive films 220 and 320, the first and second pre-insertion insulating films 230P and 330P, and the second and third upper conductive films 225 and 325 formed on the upper surface of the interlayer insulating film 190 may be removed.

Unlike as described in FIG. 26, in some embodiments, after removal of the second conductive film 326, the second pre-insertion insulating film 330P used as the etch stopping layer may be removed.

Furthermore, referring again to FIG. 24B, in some embodiments, the second conductive film 326 and the second pre-insertion insulating film 330P may be sequentially removed and the second pre-semiconductor liner 332P may remain on the third lower conductive film 320. In some embodiments, the second pre-semiconductor liner 332P may also be removed.

Figure 27:
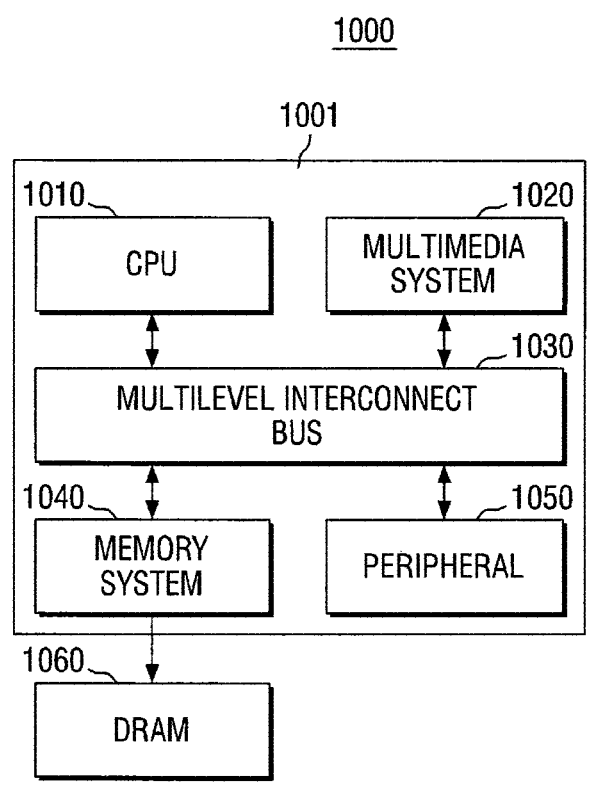
FIG. 27 is a block diagram of a system on chip (SoC) comprising a semiconductor device according to example embodiments.

FIG. 27 is a block diagram of a system on chip (SoC) comprising a semiconductor device according to example embodiments.

Referring to FIG. 27, an SoC system 1000 may include an application processor 1001 and a dynamic random-access memory (DRAM) 1060.

The application processor 1001 may include a central processing unit (CPU) 1010, a multimedia system 1020, a multilevel interconnect bus (hereinafter, "bus", 1030), a memory system 1040 and a peripheral circuit (peripheral, 1050).

The CPU 1010 may perform arithmetic operation necessary for driving of the SoC system 1000. In some example embodiments, the CPU 1010 may be configured on a multi-core environment which includes a plurality of cores.

The multimedia system 1020 may be used for performing a variety of multimedia functions of the SoC system 1000. The multimedia system 1020 may include, for example, a 3D engine module, a video codec, a display system, a camera system, a post-processor, or the like.

The bus 1030 may be used for exchanging data among the CPU 1010, the multimedia system 1020, the memory system 1040 and the peripheral circuit 1050. In some example embodiments, the bus 1030 may have a multi-layer structure. For example, the bus 1030 may be a multi-layer advanced high-performance bus (AHB), or a multi-layer advanced eXtensible interface (AXI), although embodiments are not limited thereto.

The memory system 1040 may provide environments necessary for the application processor 1001 to be connected to an external memory (e.g., DRAM 1060) and perform high-speed operation. In some example embodiments, the memory system 1040 may include a separate controller (e.g., DRAM controller) to control an external memory (e.g., DRAM 1060).

The peripheral circuit 1050 may provide environments necessary for the SoC system 1000 to have a seamless connection to an external device (e.g., main board). Accordingly, the peripheral circuit 1050 may include a variety of interfaces to allow compatible operation with the external device connected to the SoC system 1000.

The DRAM 1060 may function as an operation memory necessary for the operation of the application processor 1001. In some example embodiments, the DRAM 1060 may be arranged externally to the application processor 1001, as illustrated. Specifically, the DRAM 1060 may be packaged into a package on package (PoP) type with the application processor 1001.

At least one of the above-mentioned components of the SoC system 1000 may include at least one of the semiconductor devices according to the example embodiments.

The above-disclosed subject matter is to be considered illustrative, and not restrictive, and the appended claims are intended to cover all such modifications, enhancements, and other embodiments, which fall within the true spirit and scope of the inventive concepts. Thus, to the maximum extent allowed by law, the scope is to be determined by the broadest permissible interpretation of the following claims and their equivalents, and shall not be restricted or limited by the foregoing detailed description.

What is claimed is:

1. A semiconductor device comprising:
a fin-shaped active region protruding from a substrate;
a gate insulating layer on the substrate; and
a gate electrode structure that extends along three sides of the fin-shaped active region, on the gate insulating layer,
wherein the gate electrode structure comprises a lower conductive layer and an upper conductive layer sequentially stacked on the gate insulating layer and a silicon oxide layer between the lower conductive layer and the upper conductive layer, and the lower conductive layer comprises a barrier metal layer,
wherein the silicon oxide layer extends along a sidewall and a bottom surface of the upper conductive layer, and
wherein the three sides of the fin-shaped active region comprise top, right, and left sides of the fin-shaped active region.

2. The semiconductor device of claim 1, wherein the gate electrode structure further comprises a semiconductor liner between the silicon oxide layer and the lower conductive layer.

3. The semiconductor device of claim 2, wherein the semiconductor liner comprises a silicon layer.

4. The semiconductor device of claim 1, further comprising an interlayer insulating layer on the substrate,
wherein the interlayer insulating layer comprises a trench, and
wherein the gate insulating layer, the lower conductive layer, and the silicon oxide layer extend along a sidewall and a bottom surface of the trench.

5. The semiconductor device of claim 1, wherein a lower portion of the fin-shaped active region is wider than an upper portion of the fin-shaped active region.

6. A semiconductor device comprising: a substrate comprising a first region and a second region;
a first fin-shaped active region protruding from the first region of the substrate;
a second fin-shaped active region protruding from the second region of the substrate; a first gate insulating layer on the first fin-shaped active region;
a first gate electrode structure that extends along three sides of the first fin-shaped active region, on the first gate insulating layer, the first gate electrode structure comprising a first lower conductive layer, a first silicon oxide layer and a first upper conductive layer sequentially stacked on the first gate insulating layer, and the first lower conductive layer comprising a first barrier metal layer;
a second gate insulating layer on the second fin-shaped active region; and
a second gate electrode structure that extends along three sides of the second fin-shaped active region, on the second gate insulating layer, the second gate electrode structure comprising a second lower conductive layer and a second upper conductive layer sequentially stacked on the second gate insulating layer,
wherein the first silicon oxide layer extends along a sidewall and a bottom surface of the first upper conductive layer, wherein the three sides of the first fin-shaped active region comprise top, right, and left sides of the first fin-shaped active region, and wherein the three sides of the second fin-shaped active region comprise top, right, and left sides of the second fin-shaped active region.

7. The semiconductor device of claim 6, wherein the second gate electrode structure further comprises a second silicon oxide layer.

8. The semiconductor device of claim 7, wherein the second silicon oxide layer is disposed between the second lower conductive layer and the second upper conductive layer.

9. The semiconductor device of claim 7, wherein the second gate electrode structure further comprises a semiconductor liner between the second silicon oxide layer and the second gate insulating layer.

10. The semiconductor device of claim 7, wherein the second gate electrode structure further comprises a semiconductor liner between the second lower conductive layer and the second upper conductive layer.

11. The semiconductor device of claim 10, wherein the second gate electrode structure does not include a silicon oxide layer between the semiconductor liner and the second upper conductive layer.

12. The semiconductor device of claim 7, further comprising an interlayer insulating layer on the substrate,
   wherein the interlayer insulating layer comprises a first trench and a second trench,
   wherein the first gate insulating layer, the first lower conductive layer, and the first silicon oxide layer extend along a sidewall and a bottom surface of the first trench, and
   wherein the second gate insulating layer, the second lower conductive layer, and the second silicon oxide layer extend along a sidewall and a bottom surface of the second trench.

13. The semiconductor device of claim 6, wherein the second gate electrode structure does not include a silicon oxide layer between the second lower conductive layer and the second upper conductive layer.

14. The semiconductor device of claim 6, wherein the first gate electrode structure further comprises a semiconductor liner between the first silicon oxide layer and the first lower conductive layer.

15. The semiconductor device of claim 6, further comprising:
   a first source/drain region adjacent the first gate electrode structure, in the first fin-shaped active region; and
   a second source/drain region adjacent the second gate electrode structure, in the second fin-shaped active region.

16. A semiconductor device comprising:
   a fin-shaped active region protruding from a substrate;
   an interlayer insulating layer on the substrate, the interlayer insulating layer comprising a trench that crosses the fin-shaped active region;
   a gate insulating layer extending along a sidewall and a bottom surface of the trench; and
   a gate electrode structure that extends along three sides of the fin-shaped active region on the gate insulating layer in the trench,
   wherein the gate electrode structure comprises an insertion insulating layer that is spaced apart from the gate insulating layer and is on the sidewall and the bottom surface of the trench,
   wherein the insertion insulating layer comprises an oxide, oxynitride or nitride of a semiconductor material, and
   wherein the three sides of the fin-shaped active region comprise top, right, and left sides of the fin-shaped active region.

17. The semiconductor device of claim 16, wherein the insertion insulating layer comprises silicon oxide, silicon oxynitride, silicon nitride and/or germanium oxide.

18. The semiconductor device of claim 16, wherein the gate electrode structure further comprises a semiconductor liner between the insertion insulating layer and the gate insulating layer.

19. The semiconductor device of claim 18, wherein the semiconductor liner comprises a silicon layer, a silicon germanium layer and/or a germanium layer.

* * * * *